(12) United States Patent
Toramaru et al.

(10) Patent No.: US 11,180,848 B2
(45) Date of Patent: Nov. 23, 2021

(54) ATOMIC LAYER DEPOSITION APPARATUS, FILM-FORMING METHOD USING ATOMIC LAYER DEPOSITION APPARATUS, AND CLEANING METHOD OF ATOMIC LAYER DEPOSITION APPARATUS

(71) Applicant: THE JAPAN STEEL WORKS, LTD., Tokyo (JP)

(72) Inventors: Masamitsu Toramaru, Yokohama (JP); Keisuke Washio, Yokohama (JP); Masaki Chiba, Yokohama (JP); Masao Nakata, Yokohama (JP)

(73) Assignee: THE JAPAN STEEL WORKS, LTD., Tokyo (JP)

( * ) Notice: Subject to any disclaimer, the term of this patent is extended or adjusted under 35 U.S.C. 154(b) by 51 days.

(21) Appl. No.: 16/055,057

(22) Filed: Aug. 4, 2018

(65) Prior Publication Data

US 2019/0048463 A1 Feb. 14, 2019

(30) Foreign Application Priority Data

Aug. 10, 2017 (JP) .............................. JP2017-154942

(51) Int. Cl.
*C23C 16/44* (2006.01)
*C23C 16/455* (2006.01)
*C23C 16/54* (2006.01)

(52) U.S. Cl.
CPC ...... *C23C 16/4405* (2013.01); *C23C 16/4412* (2013.01); *C23C 16/45542* (2013.01); *C23C 16/45544* (2013.01); *C23C 16/45591* (2013.01); *C23C 16/45538* (2013.01); *C23C 16/545* (2013.01)

(58) Field of Classification Search
CPC .......... C23C 16/4405; C23C 16/45591; C23C 16/45542; C23C 16/4412; C23C 16/45544; C23C 16/45538; C23C 16/545; C23C 16/4401; C23C 16/45536
USPC ...................................... 118/715; 156/345.33
See application file for complete search history.

(56) References Cited

U.S. PATENT DOCUMENTS

| 6,251,216 B1 * | 6/2001 | Okamura ............ H01J 37/3244 118/723 E |
| 2003/0079757 A1 | 5/2003 | Shibata et al. |
| 2003/0121886 A1 * | 7/2003 | Strang ................ H01J 37/32009 216/59 |
| 2005/0039773 A1 * | 2/2005 | Moriya ................ C23C 16/4401 134/1.2 |

(Continued)

FOREIGN PATENT DOCUMENTS

| JP | 2002043288 | * | 2/2002 |
| JP | 2002-280376 A | | 9/2002 |
| JP | 2014-210946 A | | 11/2014 |

OTHER PUBLICATIONS

English Machine Translation JP2002043288_Okamoto (Year: 2002).*

*Primary Examiner* — Rakesh K Dhingra
(74) *Attorney, Agent, or Firm* — SGPatents PLLC

(57) ABSTRACT

A plasma atomic layer deposition apparatus includes: a source gas supply port functioning also as a cleaning gas supply port provided on a first side wall of a film-forming container; and a source gas exhaust port functioning also as a cleaning gas exhaust port provided on a second side wall opposed to the first side wall of the film-forming container.

4 Claims, 18 Drawing Sheets

(56) References Cited

U.S. PATENT DOCUMENTS

2006/0292310 A1* 12/2006 Le .................... C23C 16/042
  427/446
2013/0309401 A1* 11/2013 Miyatake .......... C23C 16/45542
  427/248.1
2016/0086773 A1* 3/2016 Senzaki ............ H01J 37/32834
  156/345.29

* cited by examiner

ATOMIC LAYER DEPOSITION APPARATUS, FILM-FORMING METHOD USING ATOMIC LAYER DEPOSITION APPARATUS, AND CLEANING METHOD OF ATOMIC LAYER DEPOSITION APPARATUS

CROSS-REFERENCE TO RELATED APPLICATION

The present application claims priority from Japanese Patent Application No. 2017-154942 filed on Aug. 10, 2017, the content of which is hereby incorporated by reference into this application.

TECHNICAL FIELD OF THE INVENTION

The present invention relates to an atomic layer deposition apparatus, a film-forming method using an atomic layer deposition apparatus, and a cleaning method of an atomic layer deposition apparatus.

BACKGROUND OF THE INVENTION

Japanese Patent Application Laid-Open Publication No. 2002-280376 (Patent Document 1) describes a cleaning method of a CVD (Chemical Vapor Deposition) apparatus having a shower head.

Japanese Patent Application Laid-Open Publication No. 2014-210946 (Patent Document 2) describes a technique relating to an atomic layer deposition apparatus.

SUMMARY OF THE INVENTION

The atomic layer deposition method is a film-forming method in which a film is formed in a unit of atomic layer over a substrate by alternately supplying source gas and reaction gas onto the substrate. Since the atomic layer deposition method forms a film in a unit of atomic layer, it has an advantage of excellent step coverage and film thickness controllability. On the other hand, in an atomic layer deposition apparatus that embodies the atomic layer deposition method, a film is likely to be formed at a place where the film is difficult to remove as a flip side of the advantage of excellent step coverage. For this reason, in the atomic layer deposition apparatus, there is concern that generation of a foreign matter caused by peeling of the film formed at the place where the film is difficult to remove may deteriorate the quality of the film formed over the substrate.

Other problems and novel features of the present invention will be apparent from the description of the present specification and the accompanying drawings.

An atomic layer deposition apparatus according to an embodiment includes: a cleaning gas supply port provided on a first side wall of a film-forming container; and a cleaning gas exhaust port provided on a second side wall opposed to the first side wall of the film-forming container.

According to an embodiment, it is possible to suppress the deterioration of quality of the film formed over the substrate.

BRIEF DESCRIPTIONS OF THE DRAWINGS

DESCRIPTIONS OF THE PREFERRED EMBODIMENTS

Figure 1:
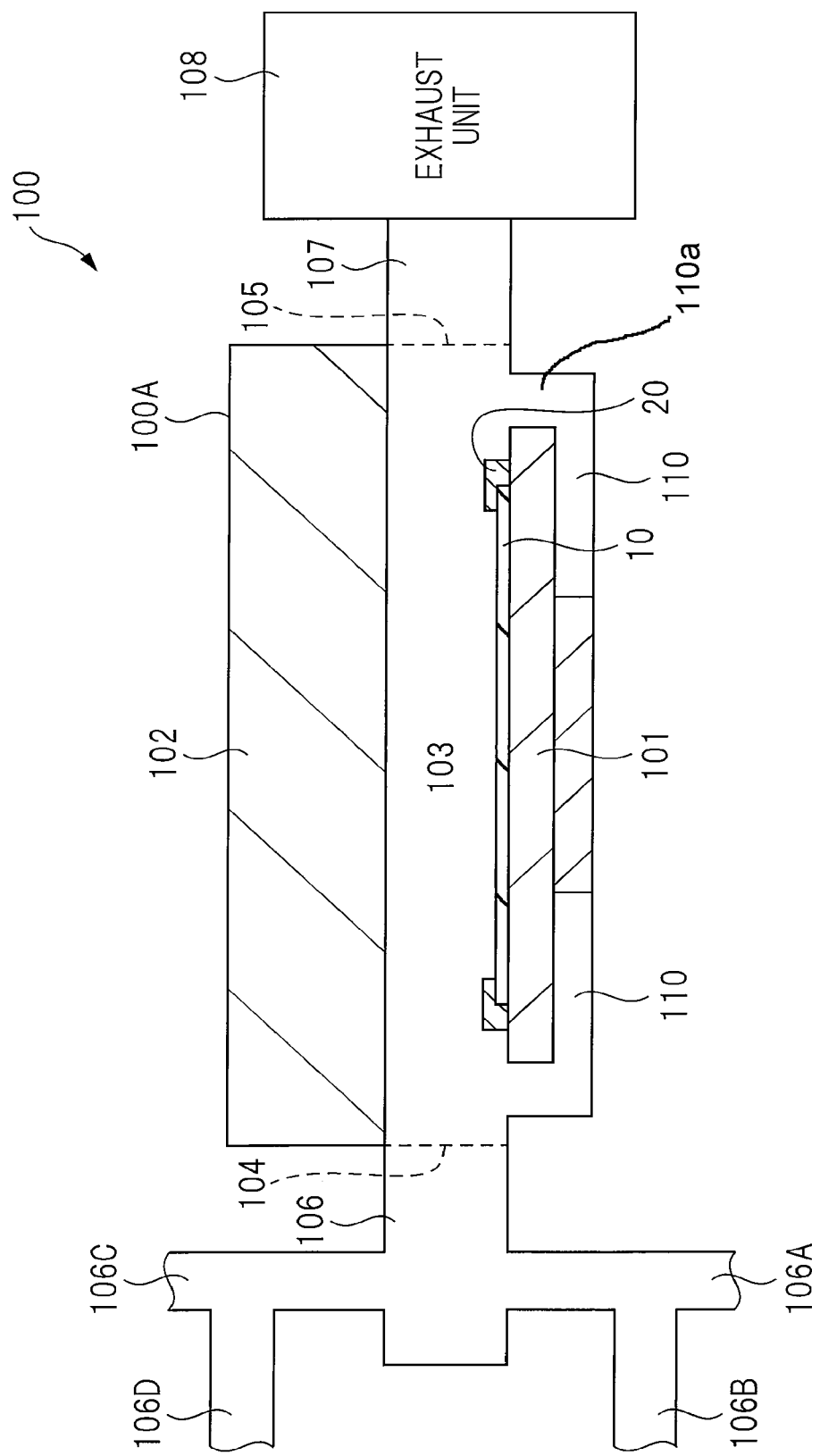
FIG. 1 is a diagram showing a schematic configuration of a plasma atomic layer deposition apparatus according to a related art.

The same components are denoted by the same reference characters throughout the drawings for describing the embodiments in principle, and the repetitive description thereof will be omitted. Also, hatching is sometimes used even in a plan view so as to make the drawing easy to see.

First Embodiment

<Unique Circumstances to Atomic Layer Deposition Apparatus>

For example, in a plasma CVD apparatus, a plasma discharge is generated between a lower electrode which holds a substrate and an upper electrode opposed to the lower electrode while supplying a plurality of source gases between the lower electrode and the upper electrode. In this manner, in the plasma CVD apparatus, a film is formed over the substrate by the chemical reaction caused by active species (radicals) generated by the plasma discharge. At this time, in the plasma CVD apparatus, the film is mainly formed in a region (discharge space) in which the plasma discharge is generated. This is because source gas having a property of being difficult to diffuse is used as the source gas used in the plasma CVD apparatus in order to localize the gas in the discharge space and a film material is formed only after active species (radicals) are generated by the plasma discharge from a plurality of source gases. Therefore, in the plasma CVD apparatus, a film is less likely to be formed at a place away from the discharge space (place where no plasma discharge is generated).

On the other hand, in the plasma atomic layer deposition apparatus, a film is formed in a unit of atomic layer over a substrate by alternately supplying source gas and reaction gas between a lower electrode which holds the substrate and an upper electrode opposed to the lower electrode and performing plasma discharge when supplying the reaction gas. At this time, in the plasma atomic layer deposition apparatus, the film with excellent step coverage can be formed by forming the film in a unit of atomic layer. Particularly, in the plasma atomic layer deposition apparatus, in order to improve the step coverage, a material which easily diffuses is used as source gas, and each of the gases (source gas, purge gas, and reaction gas) is alternately supplied while securing the time enough for each gas to diffuse sufficiently in a film-forming container. Therefore, the source gas and the reaction gas are distributed not only over the substrate but also to every corner of the film-forming container. Further, in the plasma atomic layer deposition apparatus, active species (radicals) are generated by the plasma discharge of the reaction gas and a film is formed by the reaction between the active species and the source gas adsorbed over the substrate, whereas the source gas and the reaction gas are likely to react with each other even in a state where the active species (radicals) are not generated by the plasma discharge. Therefore, in the plasma atomic layer deposition apparatus, the source gas and the reaction gas react with each other to form a film also in a small gap of the film-forming container where no plasma discharge is generated. In other words, since the atomic layer deposition apparatus has the features of: (1) a film is formed in a unit of atomic layer; (2) the source gas and the reaction gas are distributed to every corner of the film-forming container; and (3) the source gas and the reaction gas are likely to react with each other even in a place where no plasma discharge is generated, the film is formed also in a small gap.

As described above, the plasma atomic layer deposition apparatus has a characteristic that the film is formed not only over the substrate but also at every corner in the film-forming container including a small gap. Thus, in the following, a related art of the plasma atomic layer deposition apparatus will be first described. Thereafter, the room for improvement present in the related art will be described, and then, a plasma atomic layer deposition apparatus according to the first embodiment will be described.

<Description of Related Art>

FIG. 1 is a diagram showing a schematic configuration of a plasma atomic layer deposition apparatus 100 according to a related art. In FIG. 1, the plasma atomic layer deposition apparatus 100 according to a related art includes a film-forming container 100A. Also, in the film-forming container 100A, a stage including a lower electrode 101 is arranged, and a substrate 10 is mounted on the lower electrode 101. In addition, a mask 20 is arranged so as to cover an end portion of the substrate 10. Further, in the film-forming container 100A, an upper electrode 102 is arranged at a position opposed to the substrate 10 mounted on the lower electrode 101. At this time, a space sandwiched between the substrate 10 mounted on the lower electrode 101 and the upper electrode 102 serves as a film-forming space 103.

Next, as shown in FIG. 1, a source gas supply port 104 is provided on a left side wall of the film-forming container 100A, and an injector 106 is arranged so as to communicate with the source gas supply port 104. A source gas supply path 106A, a purge gas supply path 106B, a reaction gas supply path 106C, and a purge gas supply path 106D are connected to the injector 106. Here, the source gas supply path 106A is connected to a source gas supply unit (not shown), while the purge gas supply path 106B is connected to a purge gas supply unit (not shown). Similarly, the reaction gas supply path 106C is connected to a reaction gas supply unit (not shown), while the purge gas supply path 106D is connected to a purge gas supply unit (not shown). Further, as shown in FIG. 1, a gas exhaust port 105 is provided on a right side wall opposed to the left side wall of the film-forming container 100A, and the gas exhaust port 105 is connected to an exhaust unit 108 through a gas exhaust path 107.

In the plasma atomic layer deposition apparatus 100 according to a related art configured as described above, a film is formed over the substrate 10 by performing the operations shown below. First, source gas is supplied from the source gas supply unit (not shown) through the source gas supply path 106A, the injector 106, and the source gas supply port 104 to the film-forming space 103 of the film-forming container 100A. Then, the source gas supplied to the film-forming space 103 is exhausted from the exhaust unit 108 through the gas exhaust port 105 and the gas exhaust path 107. Subsequently, purge gas is supplied from the purge gas supply unit (not shown) through the purge gas supply path 106B, the injector 106, and the source gas supply port 104 to the film-forming space 103 of the film-forming container 100A. Then, the purge gas supplied to the film-forming space 103 is exhausted from the exhaust unit 108 through the gas exhaust port 105 and the gas exhaust path 107. In this manner, the remaining source gas can be removed by the purge gas. Subsequently, reaction gas is supplied from the reaction gas supply unit (not shown) through the reaction gas supply path 106C, the injector 106, and the source gas supply port 104 to the film-forming space 103 of the film-forming container 100A. At this time, a high frequency voltage is applied between the lower electrode 101 and the upper electrode 102. As a result, the reaction gas supplied to the film-forming space 103 sandwiched between the lower electrode 101 and the upper electrode 102 is turned into plasma. In this manner, a film is formed over the substrate 10. Thereafter, purge gas is supplied from the purge gas supply unit (not shown) through the purge gas supply path 106D, the injector 106, and the source gas supply port 104 to the film-forming space 103 of the film-forming container 100A. Then, the purge gas supplied to the film-forming space 103 is exhausted from the exhaust unit 108 through the gas exhaust port 105 and the gas exhaust path 107. In this manner, the remaining reaction gas can be removed by the purge gas. The film can be formed over the substrate 10 by operating the plasma atomic layer deposition apparatus 100 according to the related art in the manner described above.

<Consideration for Improvement>

Here, as described in the part of <Unique Circumstances to Atomic Layer Deposition Apparatus>, the plasma atomic layer deposition apparatus has a characteristic that the film is formed not only over the substrate but also at every corner in the film-forming container including a small gap.

Particularly, as shown in FIG. 1, since a lower space 110 (that also includes a lateral annular space 110a between the side wall of the film-forming container and a peripheral edge of the lower electrode 101) of the lower electrode (stage) 101 communicates with the film-forming space 103 in the plasma atomic layer deposition apparatus 100 according to the related art, a film is formed also on a member in contact with the lower space 110 of the lower electrode (stage) 101. Then, when a thickness of the film adhered to the member in contact with the lower space 110 is increased, a part of the adhered film peels off from the member in contact with the lower space 110 to be a foreign matter. This foreign matter causes the deterioration of the quality of the film formed over the substrate 10. Accordingly, in the plasma atomic layer deposition apparatus 100 according to the related art, there is a room for improvement from the viewpoint of improving the quality of the film formed over the substrate 10 because the lower space 110 of the lower electrode (stage) 101 communicates with the film-forming space 103. Therefore, in the first embodiment, from the viewpoint of improving the quality of the film formed over the substrate 10, an ingenuity is exercised on the room for improvement present in the plasma atomic layer deposition apparatus according to the related art. In the following, the technical idea in the first embodiment on which the ingenuity is exercised will be described.

<Configuration of Plasma Atomic Layer Deposition Apparatus>

Figure 2:
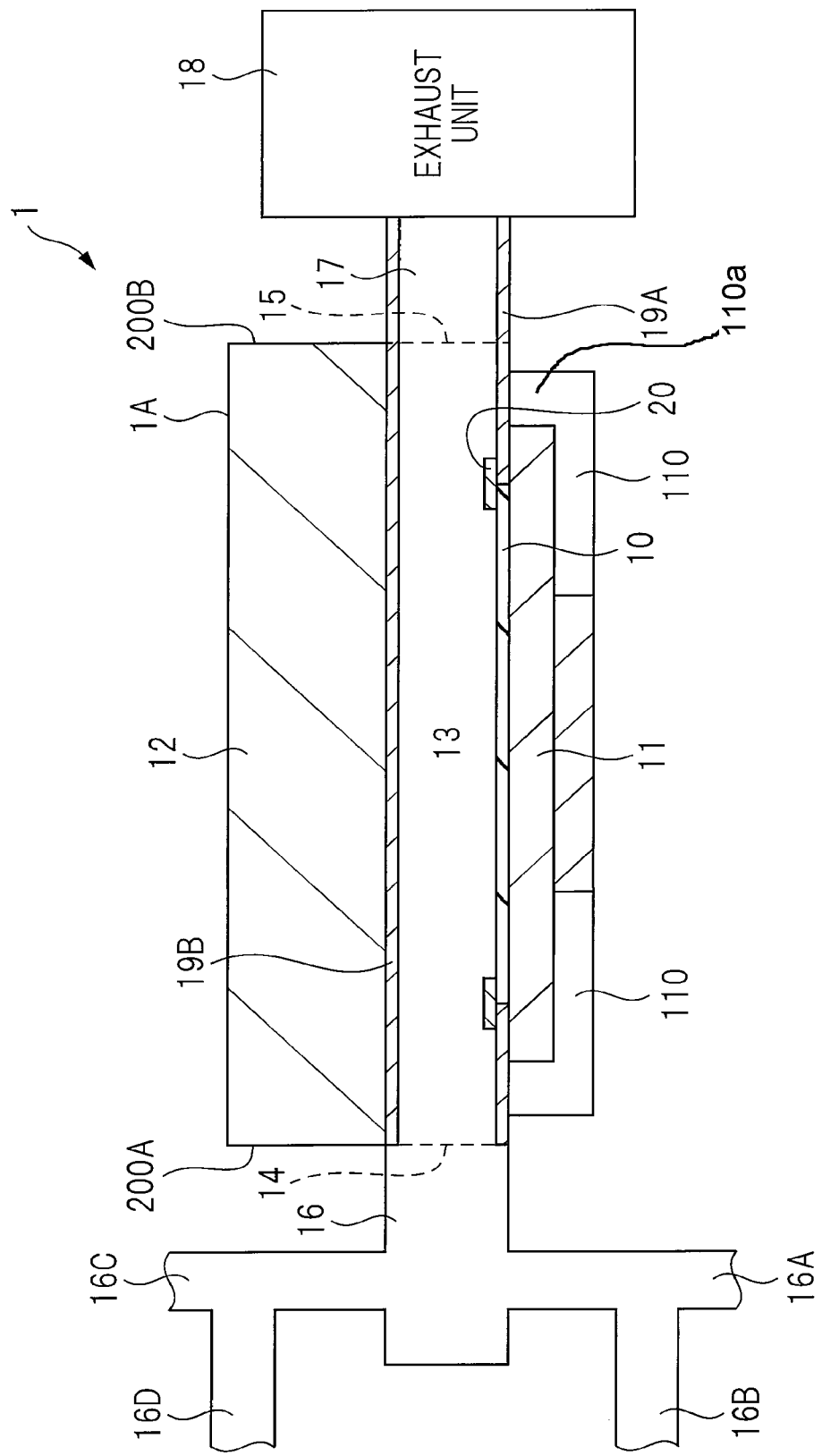
FIG. 2 is a diagram showing a schematic overall configuration of a plasma atomic layer deposition apparatus according to a first embodiment.

FIG. 2 is a diagram showing a schematic overall configuration of a plasma atomic layer deposition apparatus 1 according to the first embodiment. As shown in FIG. 2, the plasma atomic layer deposition apparatus 1 according to the first embodiment includes a film-forming container 1A. In the film-forming container 1A, a stage including a lower electrode 11 for holding a substrate 10 is arranged. Further, in the film-forming container 1A, an upper electrode 12 having an opposing surface opposed to the lower electrode 11 on which the substrate 10 is mounted is arranged such that plasma discharge is generated with the lower electrode 11. At this time, a space sandwiched between the lower electrode 11 and the upper electrode 12 serves as a film-forming space 13. Namely, the film-forming container 1A is configured to include the film-forming space 13 corresponding to an upper space of the lower electrode 11 and a lower space of the upper electrode 12.

Further, as shown in FIG. 2, the plasma atomic layer deposition apparatus 1 according to the first embodiment includes a lower adhesion preventing member 19A provided between the lower space 110 (that also includes a lateral annular space 110a between the side wall of the film-forming container 1A and a peripheral edge of the lower electrode 11) of the lower electrode (stage) 11 and the film-forming space 13. The lower adhesion preventing member 19A separates the lower space 110 of the lower electrode 11 from the film-forming space 13. In addition, in the plasma atomic layer deposition apparatus 1 according to the first embodiment, an upper adhesion preventing member 19B is attached to the opposing surface of the upper electrode 12 opposed to the lower electrode 11.

As described above, the plasma atomic layer deposition apparatus 1 according to the first embodiment includes the film-forming container 1A, the lower electrode 11 arranged on a lower surface of the film-forming container 1A, and the upper electrode 12 arranged on an upper surface of the film-forming container 1A for generating plasma discharge with the lower electrode 11. Also, the plasma atomic layer deposition apparatus 1 according to the first embodiment includes a source gas supply port 14 provided on a side surface 200A (side wall on the left side of FIG. 2) of the film-forming container 1A intersecting with the lower surface and the upper surface and a source gas exhaust port 15 provided on a side surface 200B of the film-forming container 1A intersecting with the lower surface and the upper surface and opposed to the side surface 200A. Further, in the plasma atomic layer deposition apparatus 1 according to the first embodiment includes the lower adhesion preventing member 19A in contact with both the film-forming container 1A and the lower electrode 11 and the upper adhesion preventing member 19B in contact with both the film-forming container 1A and the upper electrode 12. Note that, as shown in FIG. 2, a gap is present between the film-forming container 1A and the lower electrode 11 and the lower adhesion preventing member 19A is arranged so as to close the gap.

Figure 3:
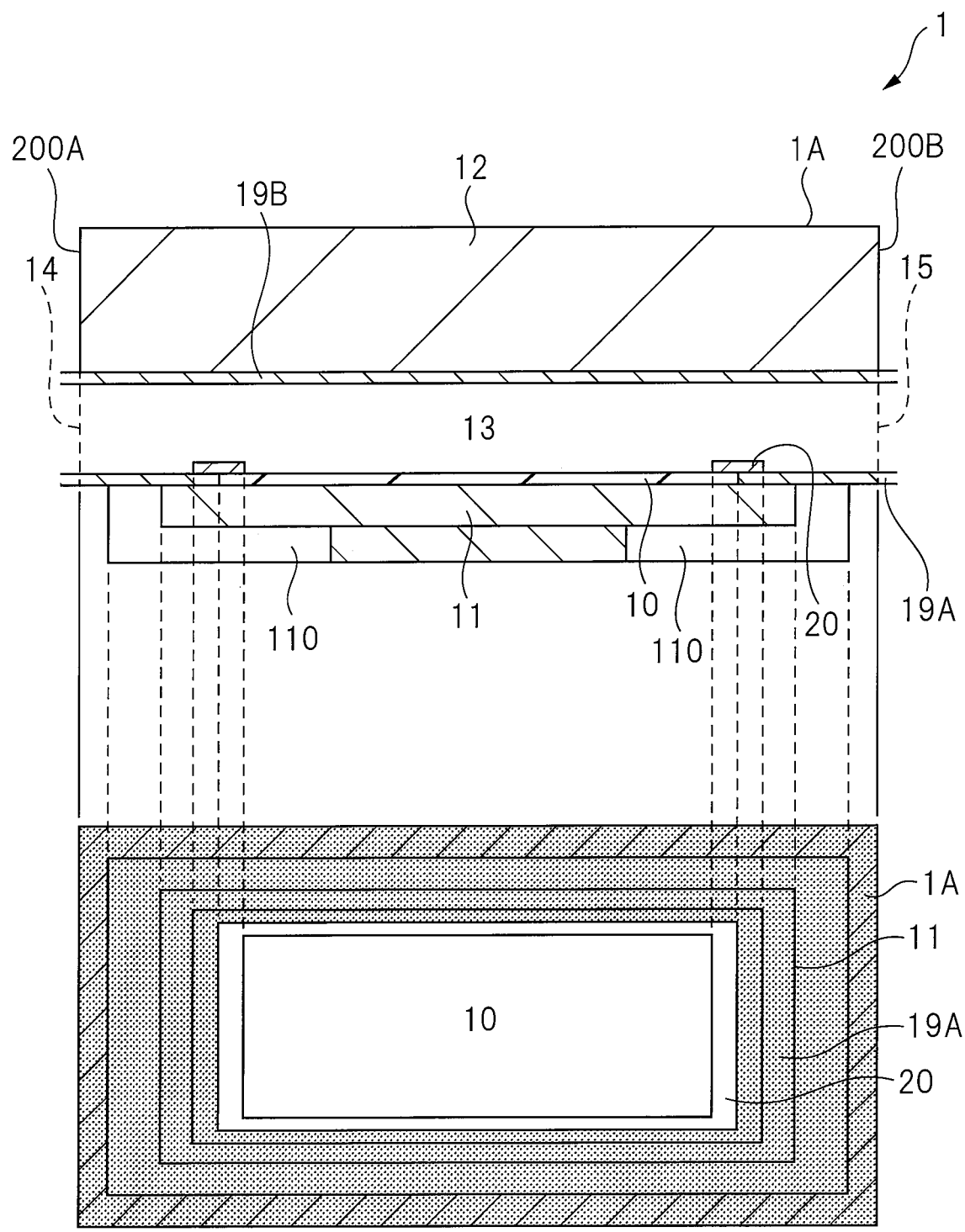
FIG. 3 is a diagram illustrating a cross-sectional view schematically showing a configuration of an inside of a film-forming container and a plan view corresponding to the cross-sectional view and mainly showing an arrangement relationship among an inner wall of the film-forming container, a lower electrode, and an adhesion preventing member in combination.

FIG. 3 is a diagram illustrating a cross-sectional view schematically showing a configuration of an inside of the film-forming container 1A and a plan view corresponding to the cross-sectional view and mainly showing an arrangement relationship among an inner wall of the film-forming container 1A, the lower electrode 11, and the lower adhesion preventing member 19A in combination. As shown in the plan view of FIG. 3, the lower electrode 11 is arranged so as to be included in the film-forming container 1A, and a gap is present between the film-forming container 1A and the lower electrode 11. Also, as shown in the plan view of FIG. 3, the lower adhesion preventing member 19A (constituent element hatched with dots) is arranged so as to be in contact with both the film-forming container 1A and an end portion of the lower electrode 11, and the lower adhesion preventing member 19A is arranged so as to cover the gap between the film-forming container 1A and the lower electrode 11. As described above, in the first embodiment, the gap between the film-forming container 1A and the lower electrode 11 is closed by the lower adhesion preventing member 19A.

Next, as shown in FIG. 2, the source gas supply port 14 communicating with the film-forming space 13 is formed on a left side wall of the film-forming container 1A. On the other hand, the source gas exhaust port 15 communicating with the film-forming space 13 is formed on a right side wall opposed to the left side wall of the film-forming container 1A. The source gas supply port 14 is connected to an injector 16, and the injector 16 is connected to a source gas supply port 16A, a purge gas supply port 16B, a reaction gas supply path 16C, and a purge gas supply path 16D. In addition, the source gas supply path 16A is connected to a source gas supply unit (not shown), while the purge gas supply path 16B is connected to a purge gas supply unit (not shown). Similarly, the reaction gas supply path 16C is connected to a reaction gas supply unit (not shown), while the purge gas supply path 16D is connected to a purge gas supply unit (not shown). Therefore, in the plasma atomic layer deposition apparatus 1 according to the first embodiment, the source gas supply port 14 functions not only as the reaction gas supply port but also as the purge gas supply port. Meanwhile, the source gas exhaust port 15 is connected to a gas exhaust path 17, and the gas exhaust path 17 is connected to an exhaust unit 18. Here, in the plasma atomic layer deposition apparatus 1 according to the first embodiment, the source gas exhaust port 15 functions not only as the reaction gas exhaust port but also as the purge gas exhaust port.

<Atomic Layer Deposition Method>

The plasma atomic layer deposition apparatus 1 according to the first embodiment is configured as described above, and an atomic layer deposition method using the plasma atomic layer deposition apparatus 1 according to the first embodiment will be described below.

Figure 4:
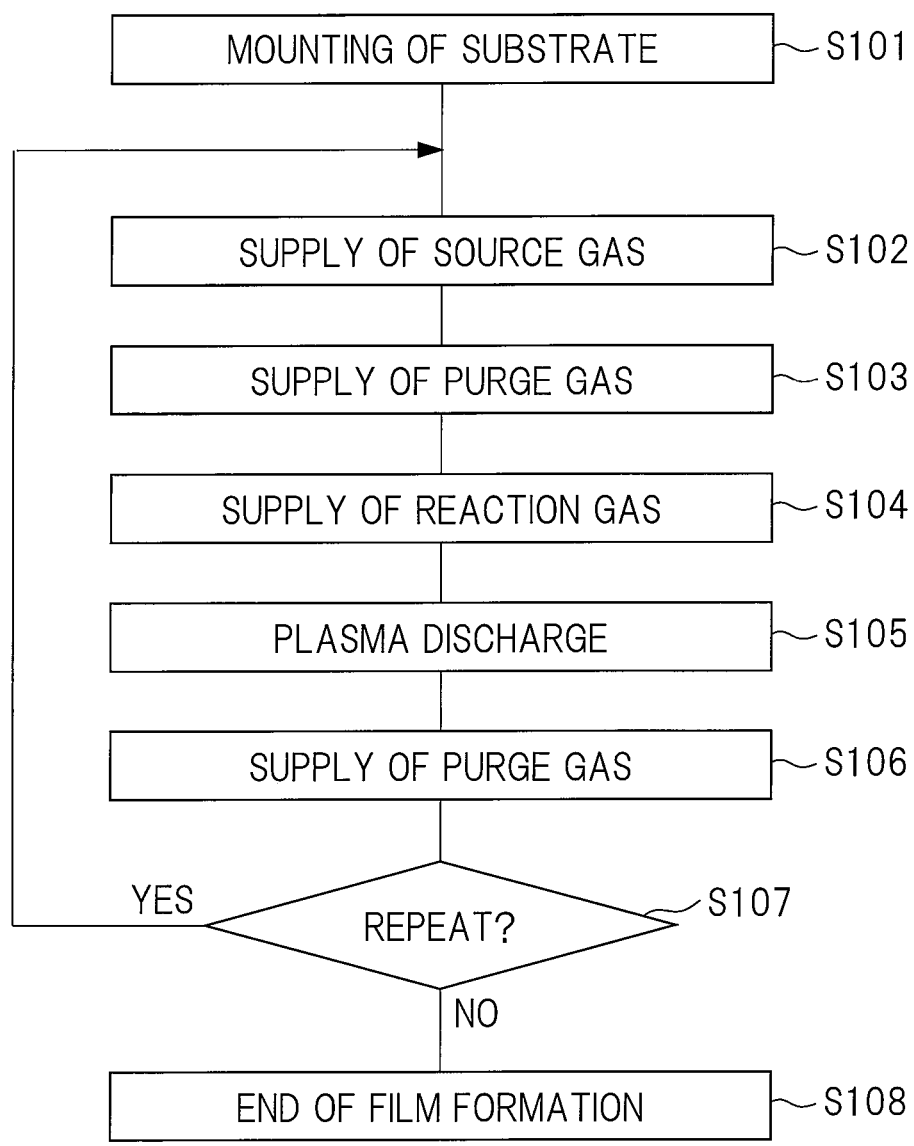
FIG. 4 is a flowchart for describing a plasma atomic layer deposition method according to the first embodiment.

FIG. 4 is a flowchart for describing the plasma atomic layer deposition method according to the first embodiment, and FIG. 5A to FIG. 5E are diagrams schematically showing the steps of forming a film over a substrate.

Figure 5A:
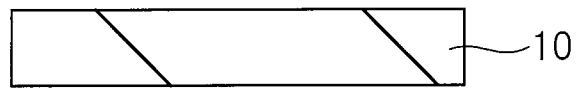
FIG. 5A to FIG. 5E are diagrams schematically showing the steps of forming a film over a substrate.
Figure 5B:
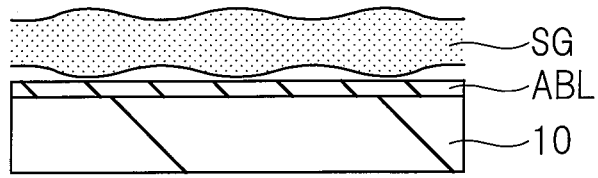

First, after preparing the substrate 10 shown in FIG. 5A, the substrate 10 is mounted on the lower electrode 11 (stage) of the plasma atomic layer deposition apparatus 1 shown in FIG. 2 (S101 in FIG. 4). Subsequently, the source gas is supplied from the source gas supply unit of the plasma atomic layer deposition apparatus 1 into the film-forming container 1A through the source gas supply path 16A, the injector 16, and the source gas supply port 14 (S102 in FIG. 4). At this time, the source gas is supplied into the film-forming container 1A for, for example, 0.1 seconds. In this manner, as shown in FIG. 5B, the source gas SG are supplied into the film-forming container 1A, and the source gas SG is adsorbed onto the substrate 10 to form an adsorption layer ABL.

Figure 5C:
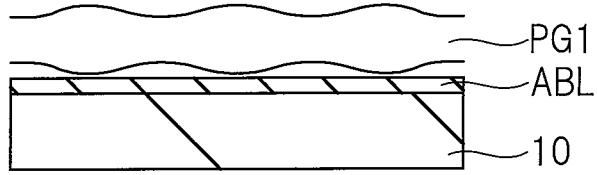

Subsequently, after the supply of the source gas stops, purge gas is supplied from the purge gas supply unit into the film-forming container 1A through the purge gas supply path 16B, the injector 16, and the source gas supply port 14 (S103 in FIG. 4). In this manner, the purge gas is supplied into the film-forming space 13, and the source gas is exhausted from the exhaust unit 18 to the outside of the film-forming container 1A through the source gas exhaust port 15 and the gas exhaust path 17. The purge gas is supplied into the film-forming container 1A for, for example, 0.1 seconds. Also, the exhaust unit 18 exhausts the source gas and the purge gas in the film-forming container 1A for, for example, 2 seconds. In this manner, as shown in FIG. 5C, the purge gas PG1 is supplied into the film-forming container 1A, and the source gas SG not adsorbed on the substrate 10 is purged from the film-forming container 1A.

Figure 5D:
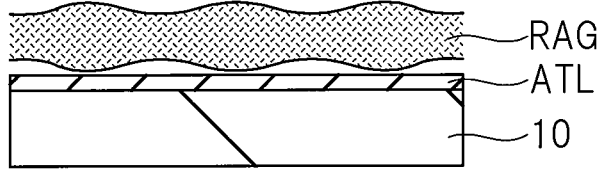

Next, reaction gas is supplied from the reaction gas supply unit into the film-forming container 1A through the reaction gas supply path 16C, the injector 16, and the source gas supply port 14 (S104 in FIG. 4). In this manner, the reaction gas is supplied into the film-forming space 13. The reaction gas is supplied into the film-forming container for, for example, 1 second. After the reaction gas is supplied, the plasma discharge is generated by applying a discharge voltage between the upper electrode 12 and the lower electrode 11 shown in FIG. 2 (S105 in FIG. 4). As a result, active species (radicals) are generated in the reaction gas. In this manner, as shown in FIG. 5D, the reaction gas RAG is supplied into the film-forming container, and the adsorption layer adsorbed on the substrate 10 chemically reacts with the reaction gas RAG, so that a thin layer made of an atomic layer ATL is formed.

Figure 5E:
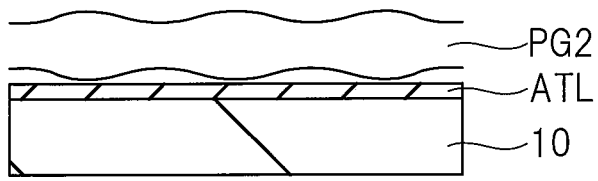

Subsequently, after the supply of the reaction gas stops, purge gas is supplied from the purge gas supply unit through the purge gas supply path 16D, the injector 16, and the source gas supply port 14 into the film-forming container 1A (S106 in FIG. 4). In this manner, the purge gas is supplied into the film-forming space 13, and the reaction gas is exhausted from the exhaust unit 18 to the outside of the film-forming container through the source gas exhaust port 15 and the gas exhaust path 17. The reaction gas is supplied into the film-forming container 1A for, for example, 0.1 seconds. Also, the exhaust unit 18 exhausts the source gas and the purge gas in the film-forming container 1A for, for example, 2 seconds. In this manner, as shown in FIG. 5E, the purge gas PG2 is supplied into the film-forming container 1A, and an excessive part of the reaction gas RAG that is not used for the reaction is purged from the film-forming container 1A.

In the above-described manner, a thin layer made of a single atomic layer ATL is formed over the substrate 10. Then, by repeating the above-described steps (S102 to S105 in FIG. 4) a predetermined number of times (S107 in FIG. 4), a thin layer made of a plurality of atomic layers ATL is formed. In this manner, the film-forming process ends (S108 in FIG. 4). In the above-described manner, the film can be formed in a unit of atomic layer over the substrate 10 by the plasma atomic layer deposition apparatus 1 according to the first embodiment.

Features in First Embodiment

Next, features in the first embodiment will be described. The first feature in the first embodiment is that the lower adhesion preventing member 19A is provided between the lower space 110 located below the lower electrode 11 and the film-forming space 13 located above the lower electrode 11 as shown in, for example, FIG. 2. Namely, the first feature in the first embodiment is that the lower space 110 located below the lower electrode 11 is separated from the film-forming space 13 by the lower adhesion preventing member 19A. Therefore, in the plasma atomic layer deposition apparatus 1 according to the first embodiment, it is possible to suppress the unnecessary film formation on the member in contact with the lower space 110 located below the lower electrode 11.

For example, as described in the part of <Unique Circumstances to Atomic Layer Deposition Apparatus>, the plasma atomic layer deposition apparatus has a characteristic that the film is formed not only over the substrate but also at every corner in the film-forming container including a small gap. Therefore, when the lower space 110 of the lower electrode (stage) 101 communicates with the film-forming space 103 like in the plasma atomic layer deposition apparatus 100 according to the related art shown in FIG. 1, the film is formed also on the member in contact with the lower space 110 of the lower electrode (stage) 101. Then, if the thickness of the film adhered to the member in contact with the lower space 110 increases, a part of the adhered film peels off from the member in contact with the lower space 110 to be a foreign matter. This foreign matter causes the deterioration of the quality of the film formed over the substrate 10.

In this regard, in the plasma atomic layer deposition apparatus 1 according to the first embodiment shown in FIG. 2, the lower space 110 located below the lower electrode 11 is separated from the film-forming space 13 located above the lower electrode 11 by the lower adhesion preventing member 19A. As a result, in the plasma atomic layer deposition apparatus 1 according to the first embodiment, it is possible to block the entry of the source gas and the reaction gas into the lower space 110 by the lower adhesion preventing member 19A. This means that the unnecessary film formation on the member in contact with the lower space 110 is suppressed. In this manner, in the plasma atomic layer deposition apparatus 1 according to the first embodiment, it is possible to reduce the occurrence potential of a foreign matter caused by the peeling of the film adhered to the member in contact with the lower space 110, and it is possible to efficiently suppress the deterioration of the quality of the film formed over the substrate 10 due to the foreign matter.

However, even when the lower space 110 located below the lower electrode 11 is separated from the film-forming space 13 by the lower adhesion preventing member 19A, since the plasma atomic layer deposition method has a characteristic that the film is likely to be formed also in a small gap, if a minute gap is present between the lower adhesion preventing member 19A and the lower electrode 11, the source gas and the reaction gas may enter the lower space 110 through the minute gap. At this time, even when the lower space 110 located below the lower electrode 11 is separated from the film-forming space 13 by the lower adhesion preventing member 19A, if the pressure in the lower space 110 is lower than the pressure in the film-forming space 13, the potential that the source gas and the reaction gas flow into the lower space with lower pressure from the film-forming space 13 with higher pressure through the minute gap present between the lower adhesion preventing member 19A and the stage (lower electrode 11) is increased.

For example, the source gas, the reaction gas, and the purge gas are supplied to the film-forming space 13, while the source gas, the reaction gas, and the purge gas are not supplied to the lower space 110 separated from the film-forming space 13 by the lower adhesion preventing member 19A. Therefore, if no measures are taken, it is inevitable that the pressure in the lower space 110 will be lower than the pressure in the film-forming space 13. Accordingly, in the case where the pressure in the lower space 110 is lower than the pressure in the film-forming space 13, even if the first feature in the first embodiment described above is adopted, there is probability that the unnecessary film is formed on the member in contact with the lower space 110. Thus, on the premise that the first feature of separating the lower space 110 from the film-forming space 13 by the lower adhesion preventing member 19A is adopted, making the pressure in the lower space 110 higher than the pressure in the film-forming space 13 may be conceivable. However, when the pressure in the lower space 110 is made higher than the pressure in the film-forming space 13, the potential that the foreign matter which is present in the lower space 110 enters the film-forming space 13 for some reasons is increased. Thus, in the plasma atomic layer deposition apparatus 1 according to the first embodiment, on the premise that the first feature of separating the lower space 110 from the film-forming space 13 by the lower adhesion preventing member 19A is adopted, the pressure in the lower space 110 is made equal to the pressure in the film-forming space 13. Namely, the second feature in the first embodiment is that the pressure in the lower space 110 is made equal to the pressure in the film-forming space 13 on the premise of the above-described first feature. Thus, according to the second feature in the first embodiment, it is possible to further lower the potential that the source gas and the reaction gas flow into the lower space 110 while keeping the advantages of the first feature described above, and also possible to reduce the potential that the foreign matter flows from the lower space 110 into the film-forming space 13.

From the above, in the case of adopting the first feature and the second feature in the first embodiment, it is possible to effectively improve the quality of the film to be formed over the substrate 10 by the synergistic effect brought by the first feature and the second feature.

Subsequently, the third feature in the first embodiment is that the upper adhesion preventing member 19B is attached to the opposing surface (lower surface) of the upper electrode 12 opposed to the lower electrode 11 as shown in FIG. 2. Thus, according to the third feature in the first embodiment, it is possible to suppress the unnecessary films from being formed over the upper electrode 12 itself.

For example, when the upper adhesion preventing member 19B is not attached to the upper electrode 12 itself, an unnecessary film is formed over the upper electrode 12 itself. In this case, the film is peeled off from the upper electrode 12 itself to generate a foreign matter, and this foreign matter is deposited onto the substrate 10 mounted on the lower electrode 11 positioned below the upper electrode 12. As a result, the foreign matter adheres to the substrate 10, so that the quality of the film formed over the substrate 10 is deteriorated. For this reason, it is necessary to remove the unnecessary film formed on the upper electrode 12 itself in order to suppress the deterioration of quality of the film formed over the substrate 10.

Here, for example, it is conceivable to detach the upper electrode 12 itself from the plasma atomic layer deposition apparatus 1 and then remove the unnecessary film adhered to the upper electrode 12 by wet etching. However, when the upper electrode 12 detached from the plasma atomic layer deposition apparatus 1 is subjected to wet etching and the upper electrode 12 is attached to the plasma atomic layer deposition apparatus 1 again, the attachment position of the upper electrode 12 becomes different from the previous attachment position. In this case, the state of the plasma discharge between the upper electrode 12 and the lower electrode 11 changes. In other words, in the method of detaching the upper electrode 12 and removing the unnecessary film formed on the upper electrode 12 by wet etching, the attachment position of the upper electrode 12 itself cannot be reproduced, so that the attachment position of the upper electrode 12 changes, resulting in that the film forming conditions represented by the state of plasma discharge may change. In this case, there is the possibility that the quality of the film formed over the substrate 10 may be fluctuated. Further, in the method of removing the unnecessary film adhered to the upper electrode 12 itself by wet etching, it is necessary to detach the upper electrode 12 from the film-forming container 1A of the plasma atomic layer deposition apparatus 1 after the interior of the film-forming container 1A is released to the atmospheric pressure, which leads to decrease in maintenance workability.

Accordingly, in the first embodiment, the upper adhesion preventing member 19B is attached to the opposing surface (lower surface) of the upper electrode 12 opposed to the lower electrode 11. Thus, according to the first embodiment, it is possible to suppress the unnecessary film from being formed on the upper electrode 12 itself. Namely, when the third feature in the first embodiment is adopted, the unnecessary film is not formed on the upper electrode 12 itself but is formed on the upper adhesion preventing member 19B attached to the upper electrode 12. In this case, the upper adhesion preventing member 19B having the unnecessary film formed thereon is detached from the upper electrode 12, and the unnecessary film formed on the upper adhesion preventing member 19B is removed. In other words, according to the third feature in the first embodiment, since it is not necessary to detach the upper electrode 12 itself from the plasma atomic layer deposition apparatus 1, it is possible to reduce the occurrence potential of the foreign matter without causing the change in the film forming conditions represented by the plasma discharge condition. Namely, according to the third feature in the first embodiment, it is possible to reduce the occurrence potential of the foreign matter while suppressing the fluctuation in the quality of the film formed over the substrate 10 due to the change in the film forming conditions. Furthermore, according to the third feature in the first embodiment, since it is only necessary to detach the upper adhesion preventing member 19B from the upper electrode 12 and it is not necessary to detach the upper electrode 12 itself from the plasma atomic layer deposition apparatus 1, it is possible to achieve the remarkable effect that the maintenance workability can be improved.

Next, the fourth feature in the first embodiment is that the lower adhesion preventing member 19A and the upper adhesion preventing member 19B are arranged in parallel to each other such that the gas flow in the film-forming space 13 is smoothed. Particularly, in the atomic layer deposition method, it is important to smoothly supply the gases (source gas, purge gas, reaction gas) to the film-forming space 13 and exhaust the gases (source gas, purge gas, reaction gas) from the film-forming space 13 in order to improve the film thickness uniformity of the film formed over the substrate 10. Furthermore, it is important to increase the conductance indicating the gas flowability in order to achieve satisfactory film formation in a unit of atomic layer by the atomic layer deposition method.

In this regard, for example, in the plasma atomic layer deposition apparatus 100 according to the related art shown in FIG. 1, since the film-forming space 103 communicates with the lower space 110, the circumfluent flow of the gas to the lower space 110 occurs. As a result, in the plasma atomic layer deposition apparatus 100 according to the related art shown in FIG. 1, turbulence flow is likely to occur in the gas flowing through the film-forming space 103 due to the circumfluent flow of the gas to the lower space 110. This means that the gas flow through the film-forming space 103 is likely to fluctuate in the plasma atomic layer deposition apparatus 100 according to the related art shown in FIG. 1. As a result, there is concern that the thickness of the film formed over the substrate 10 may fluctuate and the conductance of the gas flowing through the film-forming space 103 may decrease.

On the other hand, in the plasma atomic layer deposition apparatus 1 according to the first embodiment, for example, the lower adhesion preventing member 19A that closes the lower space 110 and the upper adhesion preventing member 19B that is attached to the opposing surface (lower surface) of the upper electrode 12 are arranged in parallel to each other as shown in FIG. 2. In this manner, in the plasma atomic layer deposition apparatus 1 according to the first embodiment, the circumfluent flow of the gas to the lower space 110 does not occur, and thus the turbulence flow is less likely to occur in the gas flowing through the film-forming space 13. This means that the gas flowing through the film-forming space 13 can be made constant in the plasma atomic layer deposition apparatus 1 according to the first embodiment. As a result, the film thickness uniformity of the film formed over the substrate 10 can be improved. Furthermore, in the plasma atomic layer deposition apparatus 1 according to the first embodiment, since the flow of the gas in the film-forming space 13 can be smoothed, the conductance of the gas flowing through the film-forming space 13 can be improved. As a result, it is possible to achieve satisfactory film formation in a unit of atomic layer.

Second Embodiment

In the first embodiment, the technical idea in which the occurrence potential of the foreign matter in the film-forming container is reduced by suppressing the formation of the unnecessary film on the member in contact with the lower space, thereby improving the quality of the film formed over the substrate has been described. In the second embodiment, the technical idea in which the occurrence potential of the foreign matter in the film-forming container is reduced by further removing the unnecessary film formed in the film-forming container, thereby improving the quality of the film formed over the substrate, while adopting the configuration of the plasma atomic layer deposition apparatus 1 according to the first embodiment, will be described. Specifically, in the second embodiment, an example in which a cleaning mechanism is provided in the plasma atomic layer deposition apparatus according to the first embodiment will be described.

Figure 6:
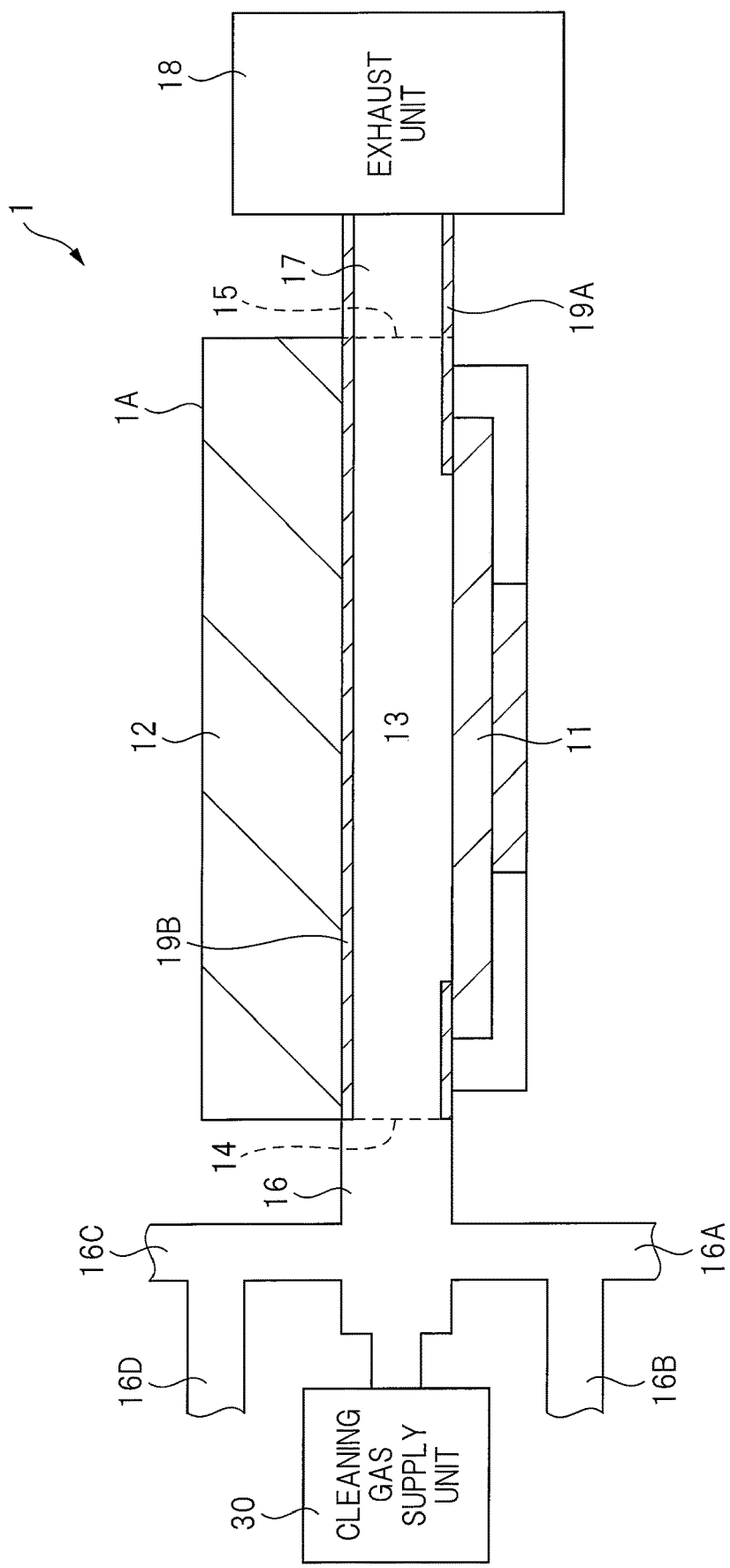
FIG. 6 is a diagram showing a schematic overall configuration of a plasma atomic layer deposition apparatus according to a second embodiment.

FIG. 6 is a diagram showing a schematic overall configuration of the plasma atomic layer deposition apparatus 1 according to the second embodiment. In FIG. 6, the plasma atomic layer deposition apparatus 1 according to the second embodiment differs from the plasma atomic layer deposition apparatus 1 according to the first embodiment shown in FIG. 2 in that a cleaning gas supply unit 30 is connected to the injector 16.

In FIG. 6, the cleaning gas supply unit 30 is configured to turn cleaning gas containing fluorine into plasma to generate cleaning gas containing fluorine radicals. Also, the plasma atomic layer deposition apparatus 1 according to the second embodiment is configured to introduce cleaning gas containing fluorine radicals generated in the cleaning gas supply unit 30 into the film-forming space 13 from the source gas supply port 14, and is configured to then exhaust the cleaning gas from the exhaust unit 18 through the source gas exhaust port 15 and the gas exhaust path 17. Accordingly, in the plasma atomic layer deposition apparatus 1 according to the second embodiment, the source gas supply port 14 functions also as a cleaning gas supply port that introduces the cleaning gas containing fluorine radicals into the film-forming space 13. Similarly, the source gas exhaust port 15 functions also as a cleaning gas exhaust port that exhausts the cleaning gas to the outside of the film-forming container 1A.

In the plasma atomic layer deposition apparatus 1 according to the second embodiment, the unnecessary film formed on the member in contact with the film-forming space 13 chemically reacts with the fluorine radicals contained in the cleaning gas to be gasified, and the gasified product is exhausted from the film-forming space 13 to the outside of the film-forming container 1A through the exhaust unit 18. As a result, in the plasma atomic layer deposition apparatus 1 according to the second embodiment, the unnecessary film formed in the film-forming container 1A can be removed. Therefore, in the plasma atomic layer deposition apparatus 1 according to the second embodiment, the unnecessary film formed in the film-forming container 1A can be removed by the cleaning gas containing fluorine radicals, so that the occurrence potential of the foreign matter in the film-forming container 1A can be reduced. Thus, in the plasma atomic layer deposition apparatus 1 according to the second embodiment, it is possible to improve the quality of the film formed over the substrate 10. In other words, in the plasma atomic layer deposition apparatus 1 according to the second embodiment, the occurrence potential of the foreign matter in the film-forming container 1A can be reduced by the synergistic effect of the approach in the first embodiment in which the formation of the unnecessary film on the member in contact with the lower space is suppressed and the approach in which the unnecessary film formed in the film-forming container 1A is removed by the cleaning gas containing fluorine radicals. Therefore, according to the second embodiment, the quality of the film formed over the substrate 10 can be improved.

Features in Second Embodiment

Next, features in the second embodiment will be described. The fifth feature in the second embodiment is that cleaning gas containing fluorine radicals is generated by turning cleaning gas into plasma in the cleaning gas supply unit 30 provided outside the film-forming container 1A and then the cleaning gas containing fluorine radicals is introduced into the film-forming space 13 in the film-forming container 1A as shown in FIG. 6. Namely, the fifth feature in the second embodiment is that the cleaning in the film-forming container A is performed by using the so-called remote plasma.

Thus, according to the second embodiment, it is possible to effectively remove the unnecessary film formed at every corner of the film-forming container 1A.

Note that the term "remote plasma" used in the present specification means the configuration mode in which plasma is not generated inside the film-forming container 1A but is generated in the plasma supply unit provided outside the film-forming container 1A and the plasma generated in the plasma supply unit is supplied into the film-forming container 1A.

Here, for example, it is conceivable that the cleaning gas is turned into plasma by applying a high frequency voltage between the lower electrode 11 and the upper electrode 12 arranged in the film-forming container 1A after introducing the cleaning gas into the film-forming container 1A, thereby performing the cleaning in the film-forming container 1A. In this case, however, the cleaning gas turned into plasma is locally present only in the film-forming space 13 sandwiched between the lower electrode 11 and the upper electrode 12 in the film-forming container 1A. Therefore, in this cleaning method, the unnecessary film adhered to the member present in the vicinity of the film-forming space 13 sandwiched between the lower electrode 11 and the upper electrode 12 can be removed, but it is difficult to sufficiently remove the unnecessary film formed at every corner of the film-forming container 1A away from the film-forming space 13. This is because the cleaning gas turned into plasma is locally present in the vicinity of the film-forming space 13 sandwiched between the lower electrode 11 and the upper electrode 12 and thus the cleaning gas turned into plasma does not reach the corner portions of the film-forming container 1A. In particular, as described in the part of <Unique Circumstances to Atomic Layer Deposition Apparatus>, the plasma atomic layer deposition apparatus 1 has a characteristic that the film is formed not only over the substrate 10 but also at every corner in the film-forming container 1A including a small gap. Therefore, it is important to perform the cleaning up to every corner portion in the film-forming container 1A in the plasma atomic layer deposition apparatus 1. In this regard, it is difficult to perform the cleaning up to every corner portion in the film-forming container 1A in the cleaning method in which cleaning gas is turned into plasma by applying a high frequency voltage between the lower electrode 11 and the upper electrode 12 arranged in the film-forming container 1A, thereby performing the cleaning inside the film-forming container 1A. Namely, it cannot be said that this cleaning method is sufficient for realizing the technical idea in which the occurrence potential of the foreign matter in the film-forming container 1A is reduced by removing the unnecessary film formed in the film-forming container 1A, thereby improving the quality of the film formed over the substrate 10.

On the other hand, according to the fifth feature in the second embodiment in which the cleaning in the film-forming container 1A is performed by using the so-called remote plasma, it is possible to sufficiently remove the unnecessary film formed at every corner of the film-forming container 1A away from the film-forming space 13. This is because since the cleaning gas in which the fluorine radicals have been generated in advance is introduced into the film-forming container 1A in the cleaning method using the remote plasma, the cleaning gas containing fluorine radicals can be distributed to every corner of the film-forming container 1A, as compared with the cleaning method in which the cleaning gas is turned into plasma in the film-forming container 1A. Thus, in the cleaning method according the second embodiment, the unnecessary film formed at the corner portions of the film-forming container 1A can be sufficiently removed. From the above, it can be said that the cleaning method according to the second embodiment using the remote plasma is sufficient for realizing the technical idea in which the occurrence potential of the foreign matter in the film-forming container 1A is reduced by removing the unnecessary film formed in the film-forming container 1A, thereby improving the quality of the film formed over the substrate 10.

Subsequently, the sixth feature according to the second embodiment is that the cleaning gas containing fluorine radicals is introduced into the film-forming container 1A in a lateral direction and the cleaning gas containing fluorine radicals is exhausted to the outside of the film-forming container 1A in the lateral direction as shown in FIG. 6 on the premise of adopting the cleaning method using the remote plasma. Specifically, in the second embodiment, the cleaning gas containing fluorine radicals is introduced into the film-forming container 1A from the source gas supply port 14 provided on the left side wall of the film-forming container 1A, and then the cleaning gas is exhausted from the source gas exhaust port 15 provided on the right side wall opposed to the left side wall of the film-forming container 1A. Thus, according to the second embodiment, it is possible to sufficiently remove the unnecessary film formed at the corner portions of the film-forming container 1A.

For example, assuming that the cleaning method using the remote plasma is adopted, the configuration in which the cleaning gas containing fluorine radicals is introduced into the film-forming container 1A from an upper part of the film-forming container 1A is conceivable. However, when the cleaning gas containing fluorine radicals is introduced into the film-forming container 1A from an upper part of the film-forming container 1A, it is inevitable that the cleaning gas containing fluorine radicals is diffused in the lateral direction of the film-forming container 1A after being blown onto the stage including the lower electrode 11. At this time, the fluorine radicals have the property of being deactivated when they hit an obstacle such as the stage. For example, when the fluorine radicals in an active state are distributed to every corner portion of the film-forming container 1A, the reaction between the fluorine radicals in an active state and the unnecessary film formed at the corner portions of the film-forming container 1A is promoted, and it is thus possible to sufficiently remove the unnecessary film formed at the corner portions of the film-forming container 1A. On the other hand, when the fluorine radicals are deactivated, even if the fluorine radicals are distributed to every corner portion of the film-forming container 1A, the reaction between the fluorine radicals in a deactivated state and the unnecessary film formed at the corner portions of the film-forming container 1A is less likely to be promoted, and it is thus not possible to sufficiently remove the unnecessary film formed at the corner portions of the film-forming container 1A. Accordingly, in the cleaning method in which the cleaning gas containing fluorine radicals is introduced into the film-forming container 1A from an upper part of the film-forming container 1A, it is not possible to sufficiently remove the unnecessary film formed at the corner portions of the film-forming container 1A.

On the other hand, in the cleaning method according to the second embodiment in which the cleaning gas containing fluorine radicals is introduced into the film-forming container 1A in a lateral direction and the cleaning gas containing fluorine radicals is exhausted to the outside of the film-forming container 1A in the lateral direction, the cleaning gas containing fluorine radials does not hit an obstacle such as the stage and smoothly flows in the film-forming container 1A. This means that the cleaning gas containing fluorine radials in an active state can be distributed to every corner portion of the film-forming container 1A without deactivating the fluorine radicals according to the cleaning method adopting the sixth feature in the second embodiment. Therefore, according to the sixth feature in the second embodiment, since the chemical reaction between the fluorine radicals in an active state and the unnecessary film formed at the corner portions of the film-forming container 1A is promoted, it is possible to sufficiently remove the unnecessary film formed at the corner portions of the film-forming container 1A.

In particular, in the cleaning method adopting the sixth feature in the second embodiment, the source gas supply port 14 functions as a cleaning gas supply port, and the source gas exhaust port 15 functions as a cleaning gas exhaust port. This means that the cleaning gas containing fluorine radicals flows through the same path as the source gas flowing in the film-forming container 1A in the cleaning method according to the second embodiment. As a result, in the cleaning method according to the second embodiment, the unnecessary film formed in correspondence with the flowing state of the source gas can be removed without fail by the cleaning gas containing fluorine radicals that flows in the film-forming container 1A through the same path as the source gas.

<Modification>

Figure 7:
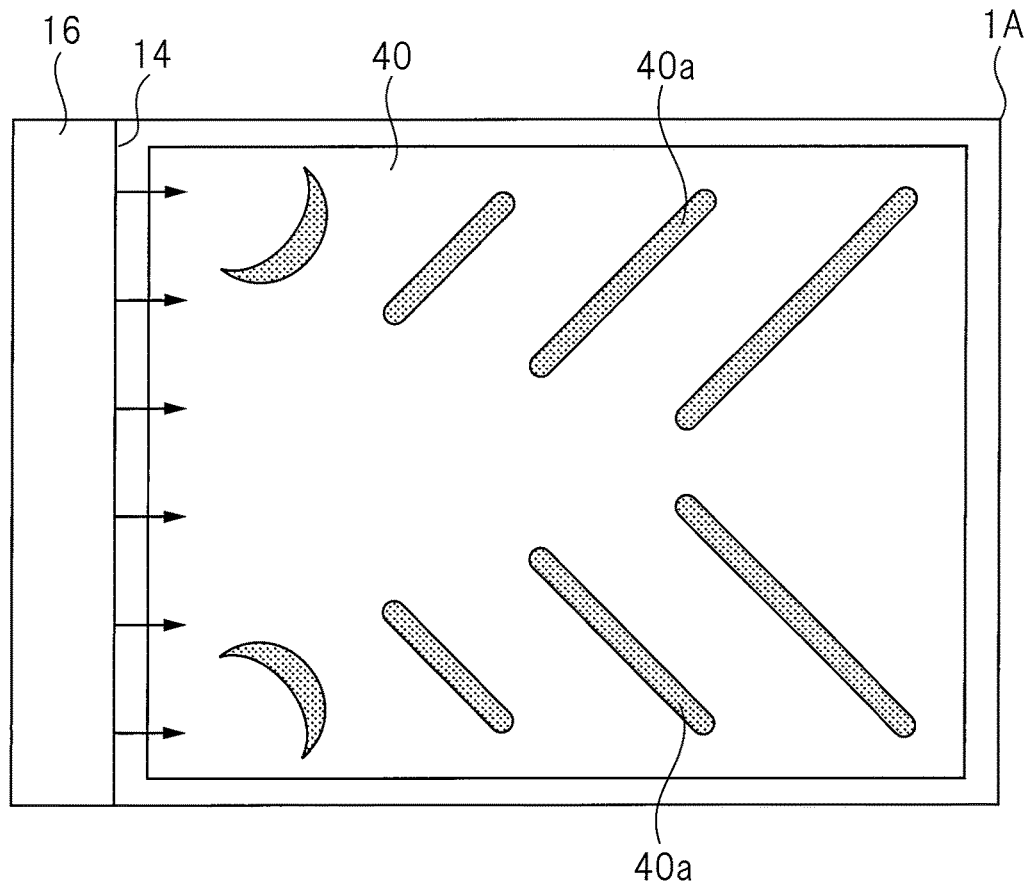
FIG. 7 is a plan view schematically showing a state in which a base plate having rectifying plates mounted thereon is arranged in the film-forming container.
Figure 8:
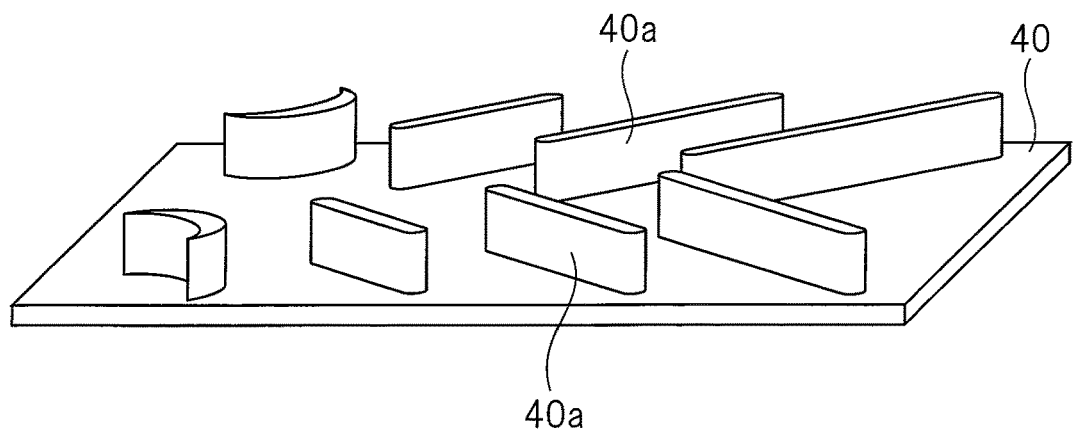
FIG. 8 is a perspective view showing a schematic configuration of the base plate having rectifying plates mounted thereon.
Figure 9:
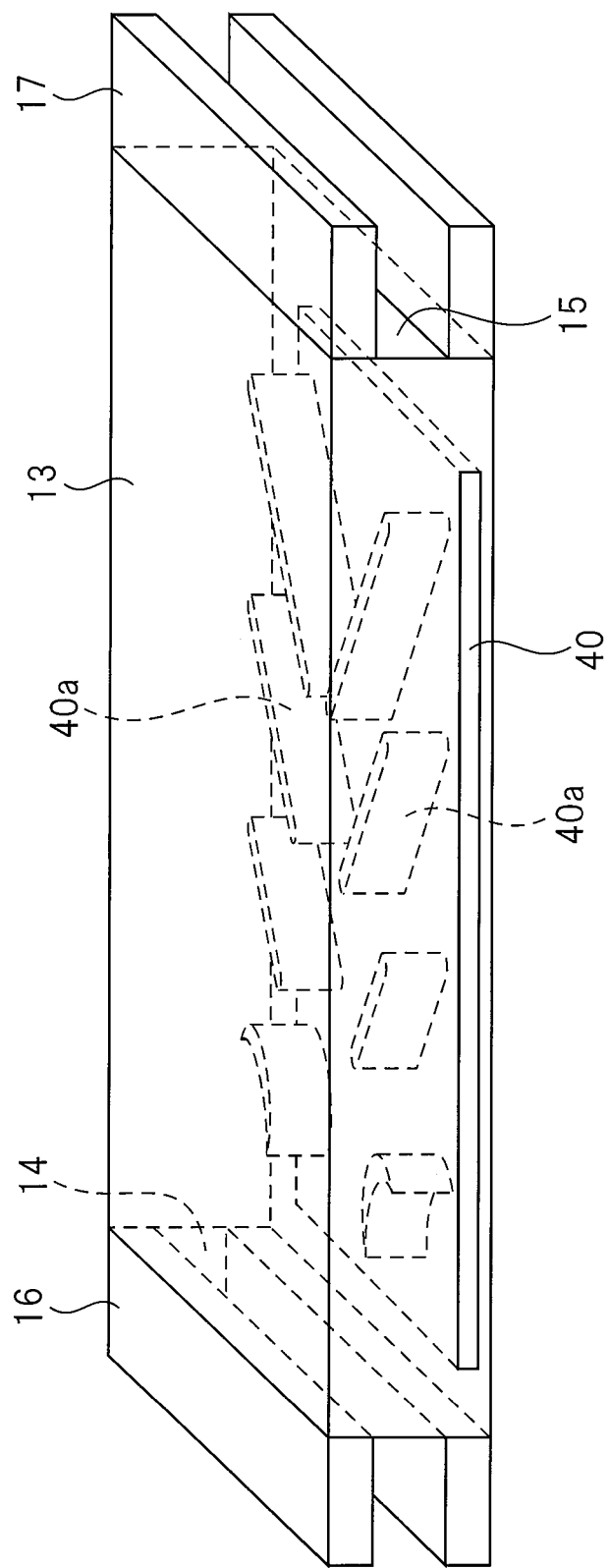
FIG. 9 is a stereoscopic perspective view schematically showing a state in which the base plate having rectifying plates mounted thereon is arranged in a film-forming space.

Subsequently, a modification of the second embodiment will be described. FIG. 7 is a plan view schematically showing a state in which a base plate 40 having rectifying plates 40a mounted thereon is arranged in the film-forming container 1A. Also, FIG. 8 is a perspective view showing a schematic configuration of the base plate 40 having rectifying plates 40a mounted thereon, and FIG. 9 is a stereoscopic perspective view schematically showing a state in which the base plate 40 having rectifying plates 40a mounted thereon is arranged in the film-forming space 13. As shown in FIG. 7 and FIG. 9, the cleaning gas containing fluorine radicals is introduced into the film-forming container 1A from the injector 16 through the source gas supply port (cleaning gas supply port) 14. At this time, the flowing direction of the cleaning gas containing fluorine radicals introduced into the film-forming container 1A is controlled by the rectifying plates 40a mounted on the base plate 40. Thus, in the plasma atomic layer deposition apparatus according to this modification, the cleaning gas containing fluorine radicals is led by the rectifying plates 40a so as to flow to the place which the cleaning gas containing fluorine radicals is difficult to reach. As a result, in the plasma atomic layer deposition apparatus according to this modification, the unnecessary film formed at every corner of the film-forming container 1A can be sufficiently removed. Thereafter, the cleaning gas containing fluorine radicals is exhausted from the gas exhaust path 17 through the source gas exhaust port (cleaning gas exhaust port) 15.

Third Embodiment

<Consideration for Further Improvement>

For example, as shown in FIG. 2, in the plasma atomic layer deposition apparatus 1 according to the first embodiment, the source gas is introduced into the film-forming space 13 from the source gas supply port 14, and the reaction gas is introduced into the film-forming space 13 from the same source gas supply port 14. Accordingly, in the plasma atomic layer deposition apparatus 1 according to the first embodiment, since the source gas and the reactant gas flow through the source gas supply port 14, there is a possibility that the source gas reacts with the reaction gas and even a slight unnecessary film is formed in the region in the vicinity of the source gas supply port 14 though the reaction gas is not turned into plasma. Then, when the unnecessary film formed in the region in the vicinity of the source gas supply port 14 is peeled off, the foreign matter made of the peeled film may enter the film-forming space 13 along the flow of the source gas and the reaction gas. In this case, there is a possibility that the foreign matter adheres to the substrate 10 and the quality of the film formed over the substrate 10 may be deteriorated. Namely, in the plasma atomic layer deposition apparatus 1 according to the first embodiment, since the source gas and the reaction gas are supplied into the film-forming space 13 through the same source gas supply port 14, the potential that the unnecessary film is formed in the region in the vicinity of the source gas supply port 14 is increased. As a result, in the plasma atomic layer deposition apparatus 1 according to the first embodiment, there is a room for improvement from the viewpoint of the deterioration of the quality of the film formed over the substrate 10 caused by the adhesion of the foreign matter to the substrate 10 due to the peeling of the unnecessary film. Thus, in the third embodiment, an ingenuity is exercised on the room for improvement present in the plasma atomic layer deposition apparatus 1 according to the first embodiment. In the following, the plasma atomic layer deposition apparatus according to the third embodiment on which the ingenuity is exercised will be described.

<Plasma Atomic Layer Deposition Apparatus>

Figure 10:
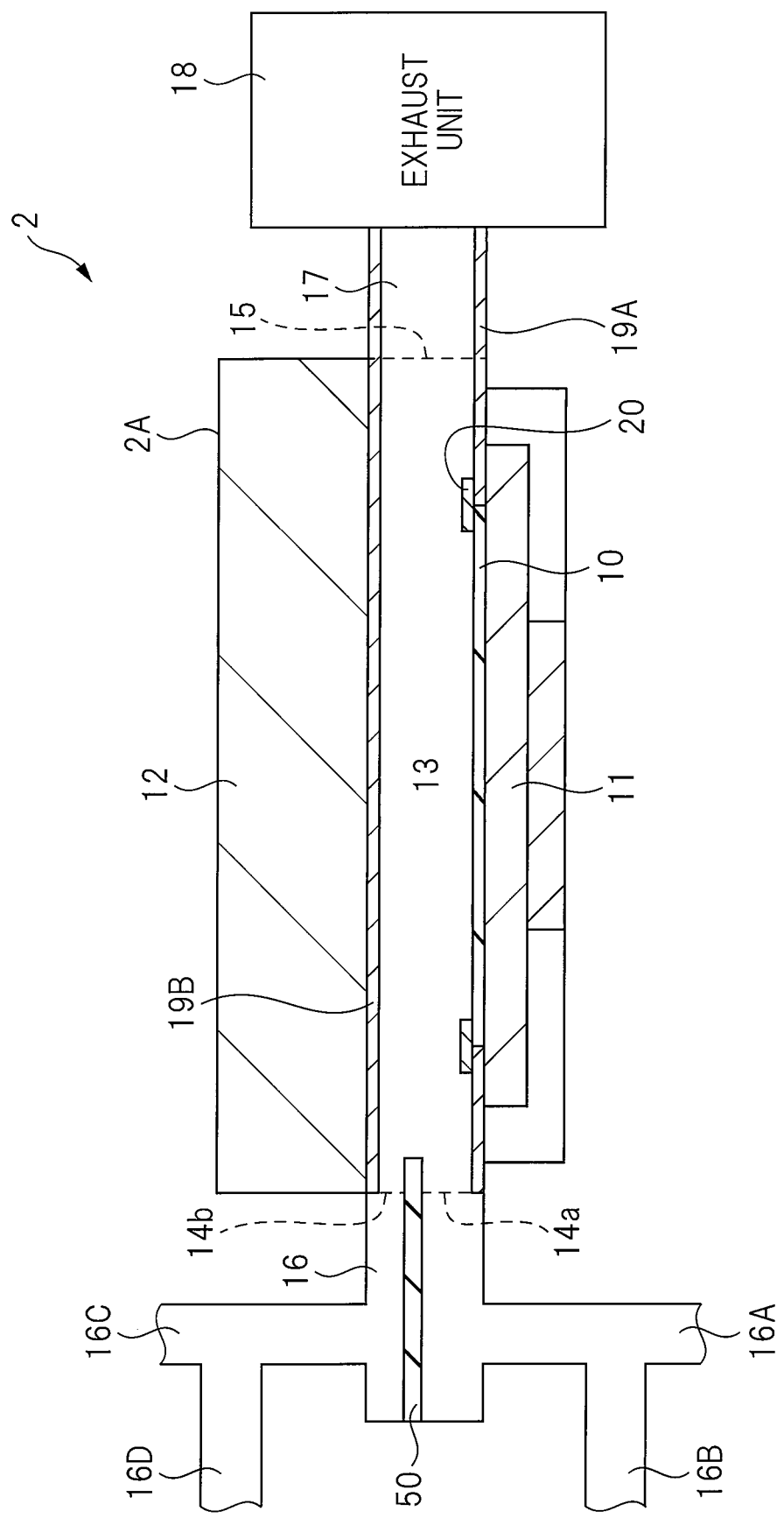
FIG. 10 is a schematic diagram showing an overall configuration of a plasma atomic layer deposition apparatus according to a third embodiment.

FIG. 10 is a schematic diagram showing an overall configuration of a plasma atomic layer deposition apparatus 2 according to the third embodiment. Since the overall configuration of the plasma atomic layer deposition apparatus 2 according to the third embodiment shown in FIG. 10 is almost the same as that of the plasma atomic layer deposition apparatus 1 according to the first embodiment shown in FIG. 2, the difference will be mainly described.

In FIG. 10, in the plasma atomic layer deposition apparatus 2 according to the third embodiment, a partition plate 50 is provided in the injector 16. Specifically, as shown in FIG. 10, in the plasma atomic layer deposition apparatus 2 according to the third embodiment, an inner space of the injector 16 is separated into one space and the other space by the partition plate 50. Further, as shown in FIG. 10, the source gas supply path 16A and the purge gas supply path 16B are connected to the one space separated by the partition plate 50, and a source gas supply port 14a communicating with the one space separated by the partition plate 50 is provided on a left side wall of a film-forming container 2A. On the other hand, as shown in FIG. 10, the source gas supply path 16C and the purge gas supply path 16D are connected to the other space separated by the partition plate 50, and a reaction gas supply port 14b communicating with the other space separated by the partition plate 50 is provided on the left side wall of the film-forming container 2A. Namely, in the third embodiment, the source gas supply port 14a and the reaction gas supply port 14b separated from each other are provided on the left side wall of the film-forming container 2A. The plasma atomic layer deposition apparatus 2 according to the third embodiment is configured as described above.

Features in Third Embodiment

Next, features in the third embodiment will be described. The seventh feature in the third embodiment is that the source gas supply port 14a for introducing the source gas into the film-forming container 2A and the reaction gas supply port 14b for introducing the reaction gas into the film-forming container 2A are provided as separate constituent elements as shown in FIG. 10. Thus, according to the third embodiment, the source gas is introduced into the film-forming container 2A from the source gas supply port 14a provided in the film-forming container 2A, and the reaction gas is introduced into the container 2A from the reaction gas supply port 14b provided in the film-forming container 2A. Accordingly, in the plasma atomic layer deposition apparatus 2 according to the third embodiment, the source gas and the reaction gas are not introduced into the film-forming container 2A from the same supply port, but the source gas and the reaction gas are introduced from different supply ports, and thus the formation of the unnecessary film in the region in the vicinity of the supply port can be suppressed. As a result, in the plasma atomic layer deposition apparatus 2 according to the third embodiment, it is possible to further reduce the formation potential of the unnecessary film which causes the deterioration of the quality of the film formed over the substrate 10, as compared with the plasma atomic layer deposition apparatus according to the first embodiment described above.

Subsequently, the eighth feature in the third embodiment is that an inner dimension size of the source gas supply port 14a is larger than an inner dimension size of the reaction gas supply port 14b as shown in FIG. 10. Thus, the conductance of the source gas supply path 16A through which the source gas flows can be improved. As a result, in the plasma atomic layer deposition apparatus 2 according to the third embodiment, it is possible to smoothly introduce the source gas with a large flow rate from the source gas supply path 16A into the film-forming container 2A through the injector 16 and the source gas supply port 14a. Namely, since it is important to smoothly supply the source gas onto the substrate 10 in the plasma atomic layer deposition apparatus 2, the inner dimension size of the source gas supply port 14a is made larger than the inner dimension size of the reaction gas supply port 14b in order to increase the conductance of the source gas supply path 16A through which the source gas flows. Therefore, according to the eighth feature in the third embodiment, it becomes easy to improve the film thickness uniformity of the film formed over the substrate 10.

<Atomic Layer Deposition Method>

The plasma atomic layer deposition apparatus 2 according to the third embodiment is configured as described above, and an atomic layer deposition method using the plasma atomic layer deposition apparatus 2 will be described below with reference to drawings.

Figure 11:
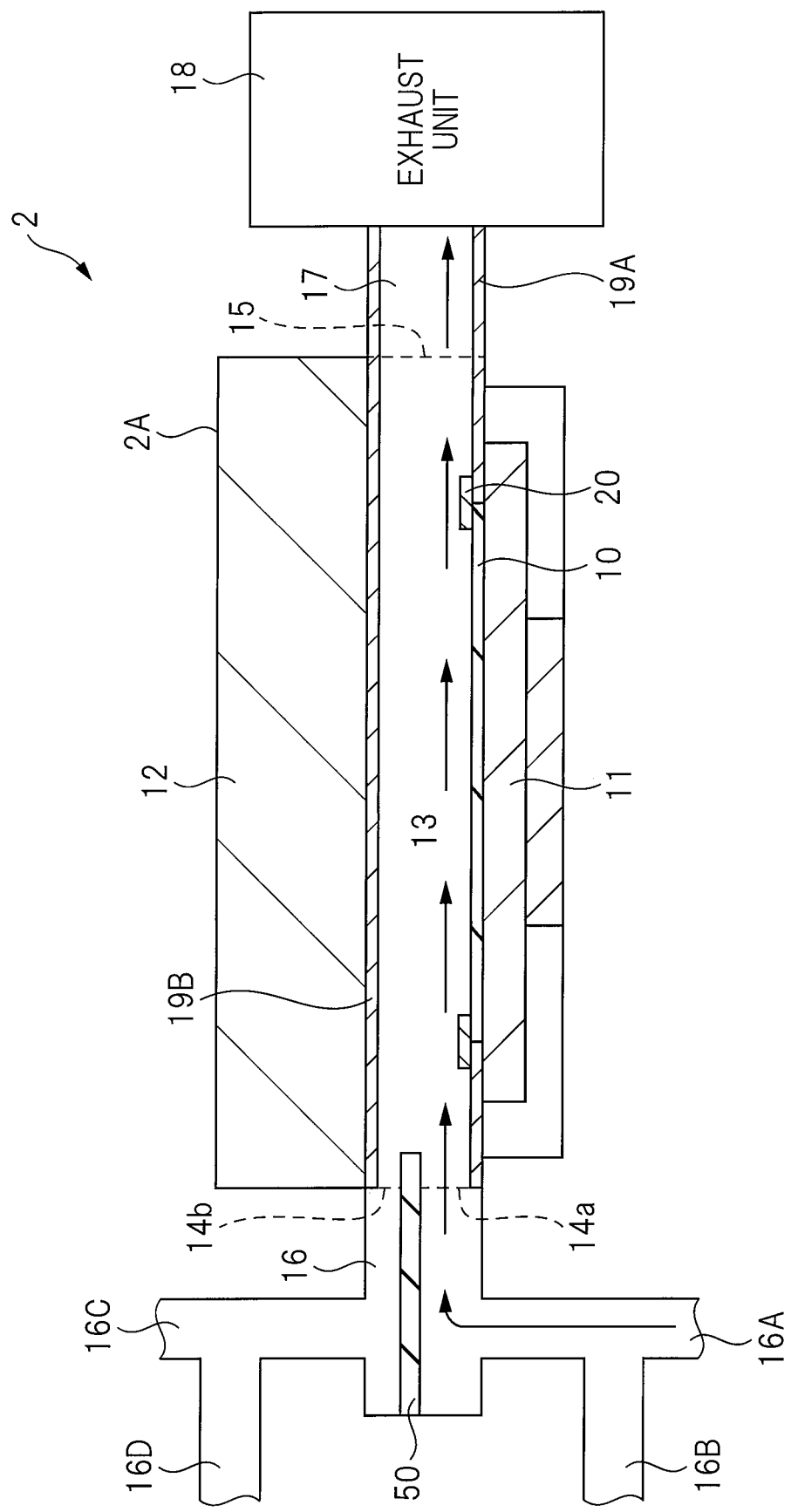
FIG. 11 is an explanatory diagram for describing a plasma atomic layer deposition process according to the third embodiment.

First, as shown in FIG. 11, the source gas supplied from a source gas supply unit (not shown) is introduced into the film-forming space 13 from the source gas supply port 14a provided in the film-forming container 2A after passing through the source gas supply path 16A and the injector 16. Thereafter, the source gas is exhausted to the outside of the film-forming container 2A from the exhaust unit 18 through the space above the substrate 10 mounted on the lower electrode 11, the source gas exhaust port 15, and the gas exhaust path 17.

Figure 12:
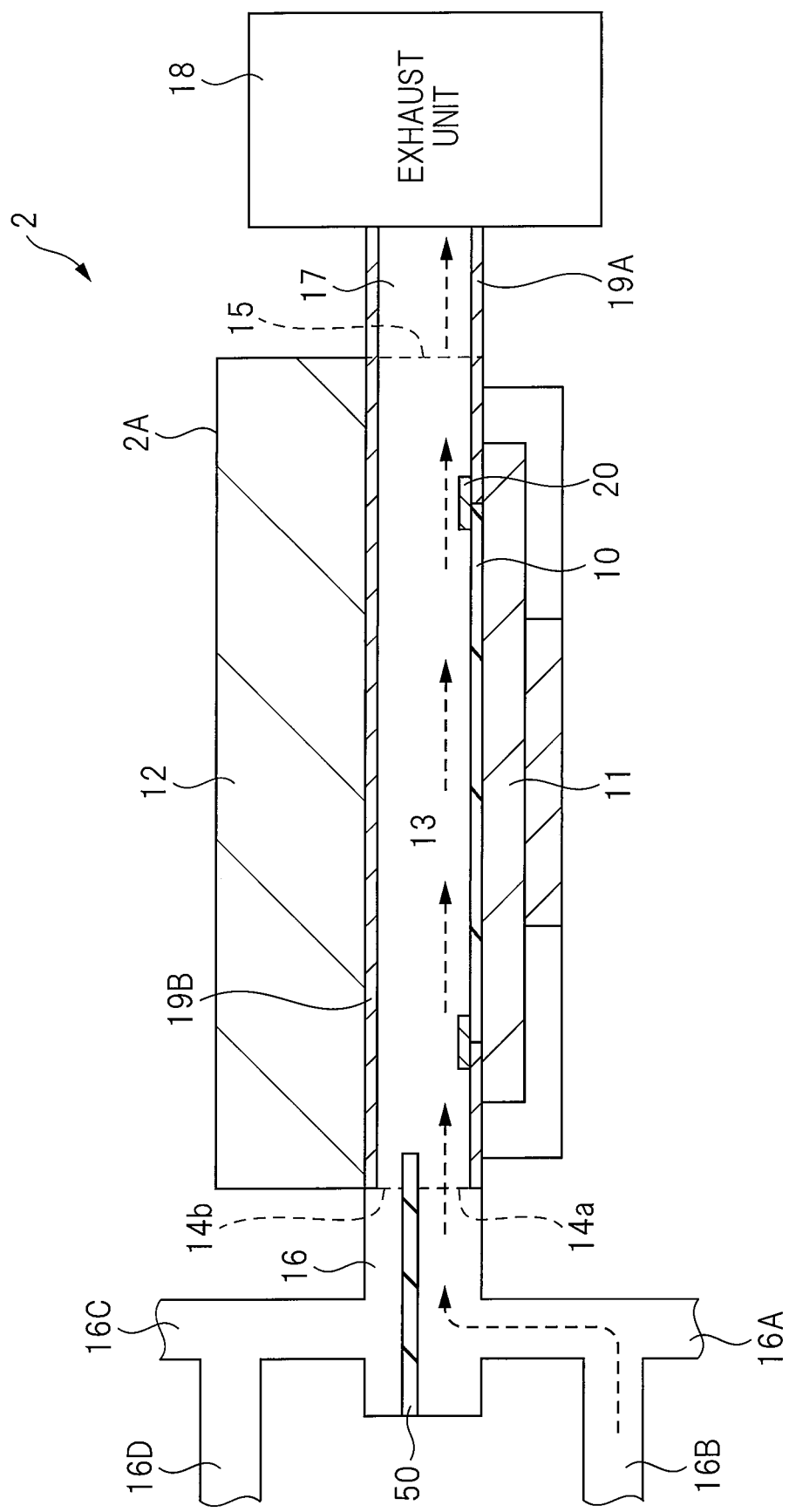
FIG. 12 is an explanatory diagram for describing the plasma atomic layer deposition process continued from FIG. 11.

Next, as shown in FIG. 12, the purge gas supplied from a purge gas supply unit (not shown) is introduced into the film-forming space 13 from the source gas supply port 14a provided in the film-forming container 2A after passing through the purge gas supply path 16B and the injector 16. Thereafter, the purge gas is exhausted to the outside of the film-forming container 2A from the exhaust unit 18 through the space above the substrate 10 mounted on the lower electrode 11, the source gas exhaust port 15, and the gas exhaust path 17.

Figure 13:
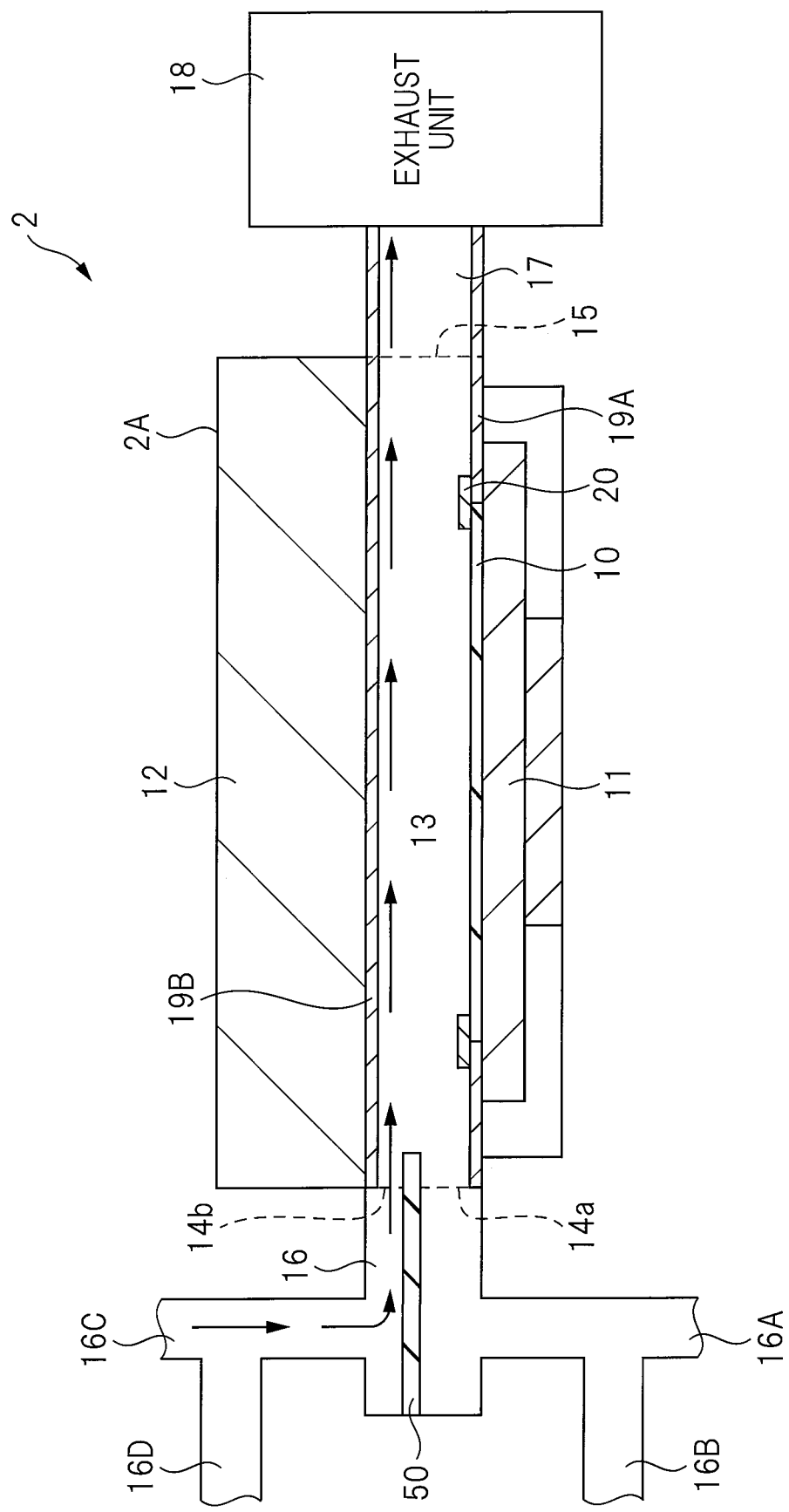
FIG. 13 is an explanatory diagram for describing the plasma atomic layer deposition process continued from FIG. 12.

Subsequently, as shown in FIG. 13, the reaction gas supplied from a reaction gas supply unit (not shown) is introduced into the film-forming space 13 from the reaction gas supply port 14b provided in the film-forming container 2A after passing through the reaction gas supply path 16C and the injector 16. Thereafter, the reaction gas is exhausted to the outside of the film-forming container 2A from the exhaust unit 18 through the space above the substrate 10 mounted on the lower electrode 11, the source gas exhaust port 15, and the gas exhaust path 17.

Figure 14:
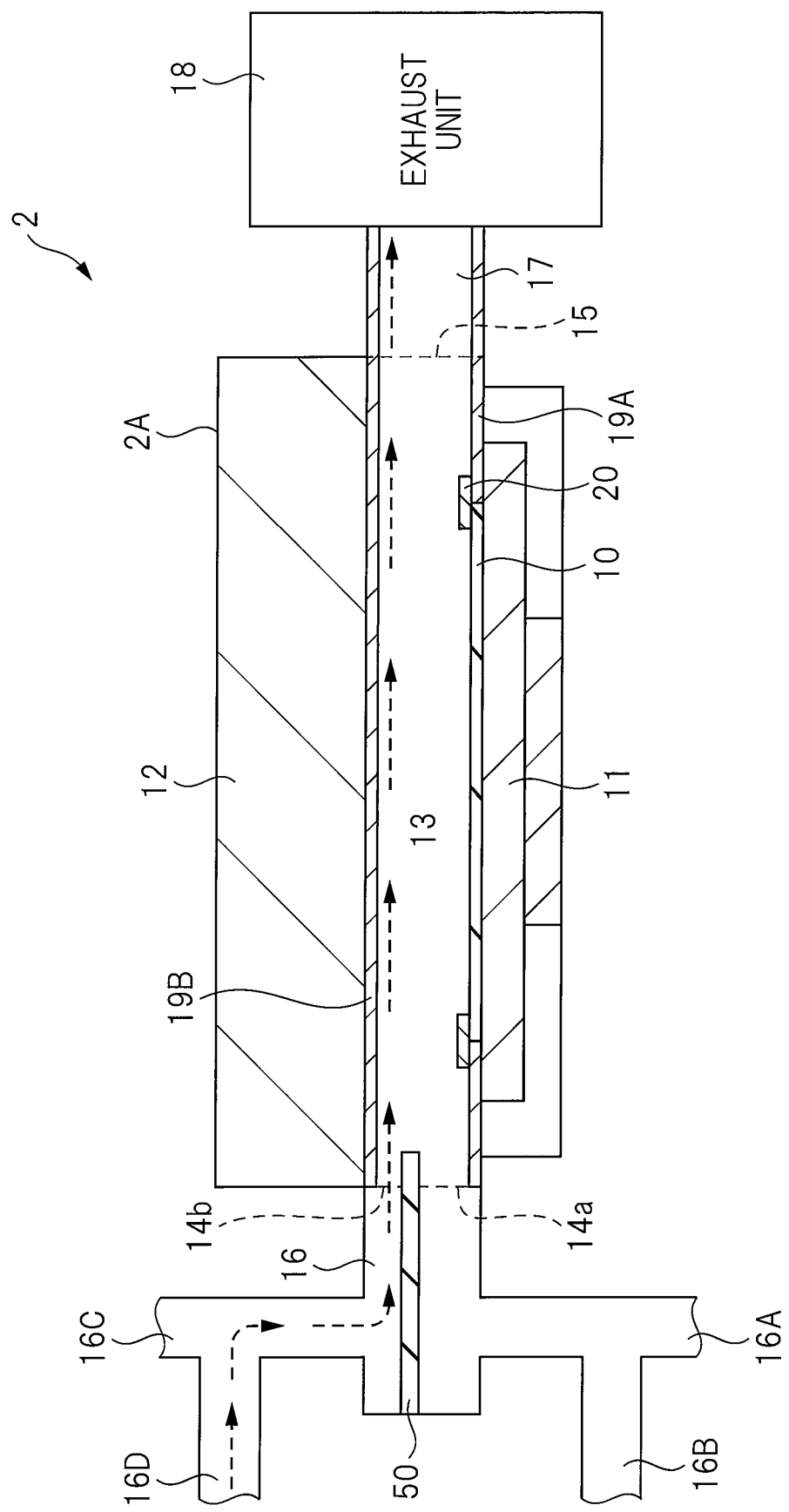
FIG. 14 is an explanatory diagram for describing the plasma atomic layer deposition process continued from FIG. 13.

Further, as shown in FIG. 14, the purge gas supplied from a purge gas supply unit (not shown) is introduced into the film-forming space 13 from the reaction gas supply port 14b provided in the film-forming container 2A after passing through the purge gas supply path 16D and the injector 16. Thereafter, the purge gas is exhausted to the outside of the film-forming container 2A from the exhaust unit 18 through the space above the substrate 10 mounted on the lower electrode 11, the source gas exhaust port 15, and the gas exhaust path 17.

In the above-described manner, it is possible to form a film in a unit of atomic layer over the substrate 10 by using the plasma atomic layer deposition apparatus 2 according to the third embodiment.

Fourth Embodiment

In the fourth embodiment, the technical idea in which the occurrence potential of the foreign matter in the film-forming container is reduced by removing the unnecessary film formed in the film-forming container, thereby improving the quality of the film formed over the substrate, on the premise of the configuration of the plasma atomic layer deposition apparatus 2 according to the third embodiment will be described. Specifically, in the fourth embodiment, the technique of cleaning the plasma atomic layer deposition apparatus in the third embodiment will be described.

Figure 15:
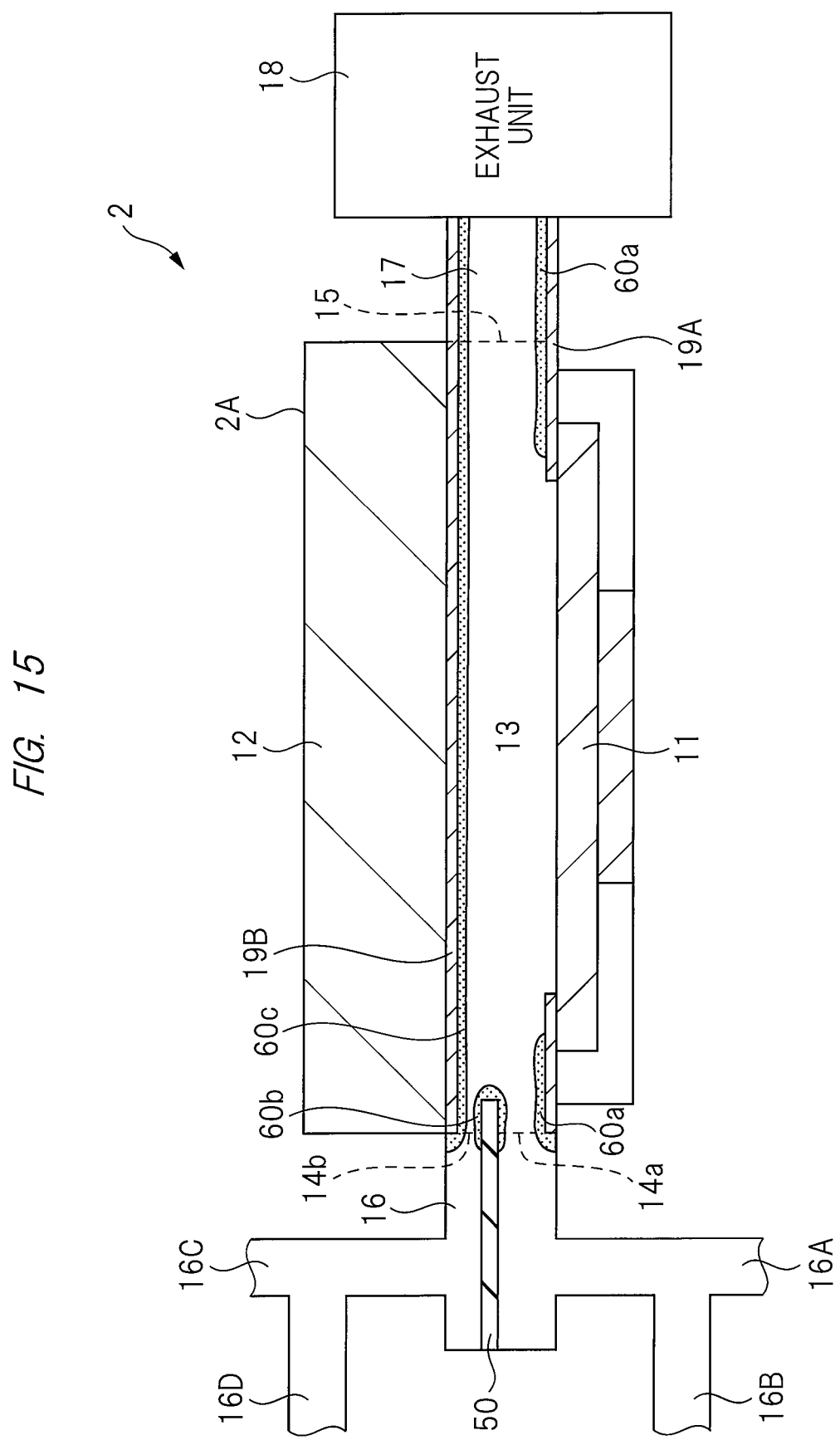
FIG. 15 is a schematic diagram showing a state in which unnecessary films are formed on inner walls of the film-forming container of the plasma atomic layer deposition apparatus according to the third embodiment.

FIG. 15 is a schematic diagram showing a state in which unnecessary films are formed on inner walls of the film-forming container 2A of the plasma atomic layer deposition apparatus 2 according to the third embodiment. As shown in FIG. 15, in the plasma atomic layer deposition apparatus 2 according to the third embodiment, for example, a film 60a is formed on a bottom side of the film-forming container 2A, a film 60b is formed in the vicinity of the periphery of the source gas supply port 14a and in the vicinity of the periphery of the reaction gas supply port 14b, and a film 60c is formed over a lower surface of the upper electrode 12. As described above, the unnecessary films are formed in the film-forming container 2A when the film-forming process is continuously performed in the plasma atomic layer deposition apparatus 2 according to the third embodiment.

Thus, in the fourth embodiment, the technical idea of cleaning the plasma atomic layer deposition apparatus 2 according to the third embodiment in which the unnecessary films are formed in the film-forming container 2A will be described.

Figure 16:
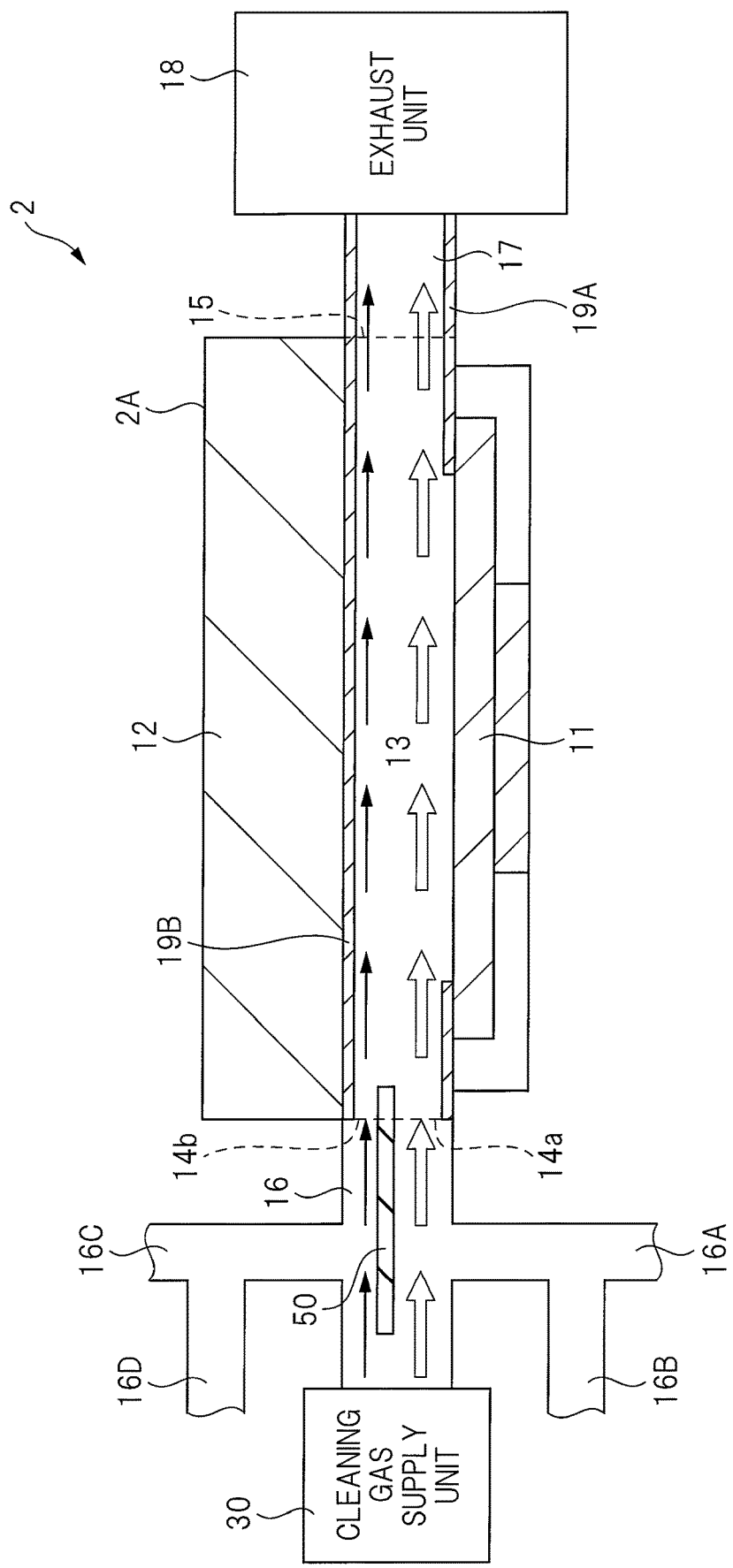
FIG. 16 is an explanatory diagram for describing a cleaning technique of a plasma atomic layer deposition apparatus according to a fourth embodiment.

FIG. 16 is an explanatory diagram for describing the cleaning technique of the plasma atomic layer deposition apparatus 2 according to the fourth embodiment. In FIG. 16, the plasma atomic layer deposition apparatus 2 according to the fourth embodiment includes a cleaning gas supply unit 30 communicating with the injector 16 having the partition plate 50 provided therein. Further, in the plasma atomic layer deposition apparatus 2 according to the fourth embodiment, cleaning gas containing fluorine radicals supplied from the cleaning gas supply unit 30 passes through the injector 16 having the partition plate 50 provided therein and is introduced into the film-forming space 13 from the source gas supply port 14a and from the reaction gas supply port 14b. Namely, in the fourth embodiment, the source gas supply port 14a functions as the cleaning gas supply port, and the reaction gas supply port 14b also functions as the cleaning gas supply port.

As described above, in the plasma atomic layer deposition apparatus 2 according to the fourth embodiment, since the cleaning gas containing fluorine radicals is introduced from both the source gas supply port 14a and the reaction gas supply port 14b, the films 60a to 60c which are the unnecessary films formed in the film-forming container 2A shown in FIG. 15 can be effectively removed. As a result, according to the fourth embodiment, on the premise of the configuration of the plasma atomic layer deposition apparatus 2 according to the third embodiment in which the occurrence potential of the foreign matter can be reduced, the unnecessary films formed in the film-forming container 2A can be removed by the cleaning gas containing fluorine radicals. Therefore, according to the fourth embodiment, it is possible to further reduce the occurrence potential of the foreign matter in the film-forming container 2A. Thus, in the plasma atomic layer deposition apparatus 2 according to the fourth embodiment, it is possible to improve the quality of the film formed over the substrate 10.

Fifth Embodiment

<Consideration for Improvement Focused on Cost Reduction>

In the cleaning method according to the fourth embodiment, as shown in FIG. 16, the cleaning gas containing fluorine radicals is introduced from both the source gas supply port 14a and the reaction gas supply port 14b. Therefore, since it is possible to increase the flow rate of the cleaning gas containing fluorine radicals introduced into the film-forming container 2A, the cleaning method according to the fourth embodiment has the advantage that the unnecessary film adhered to the inside of the film-forming container 2A can be sufficiently removed. However, the increase of the flow rate of the cleaning gas containing fluorine radicals causes an increase in cost. Therefore, in the fifth embodiment, focus is placed on the cost reduction, and an ingenuity is exercised for efficiently removing the unnecessary films adhered to the inside of the film-forming container 2A while reducing the flow rate of the cleaning gas containing fluorine radicals. In the following, the technical idea in the fifth embodiment on which the ingenuity is exercised will be described.

<Cleaning Method in Fifth Embodiment>

Figure 17:
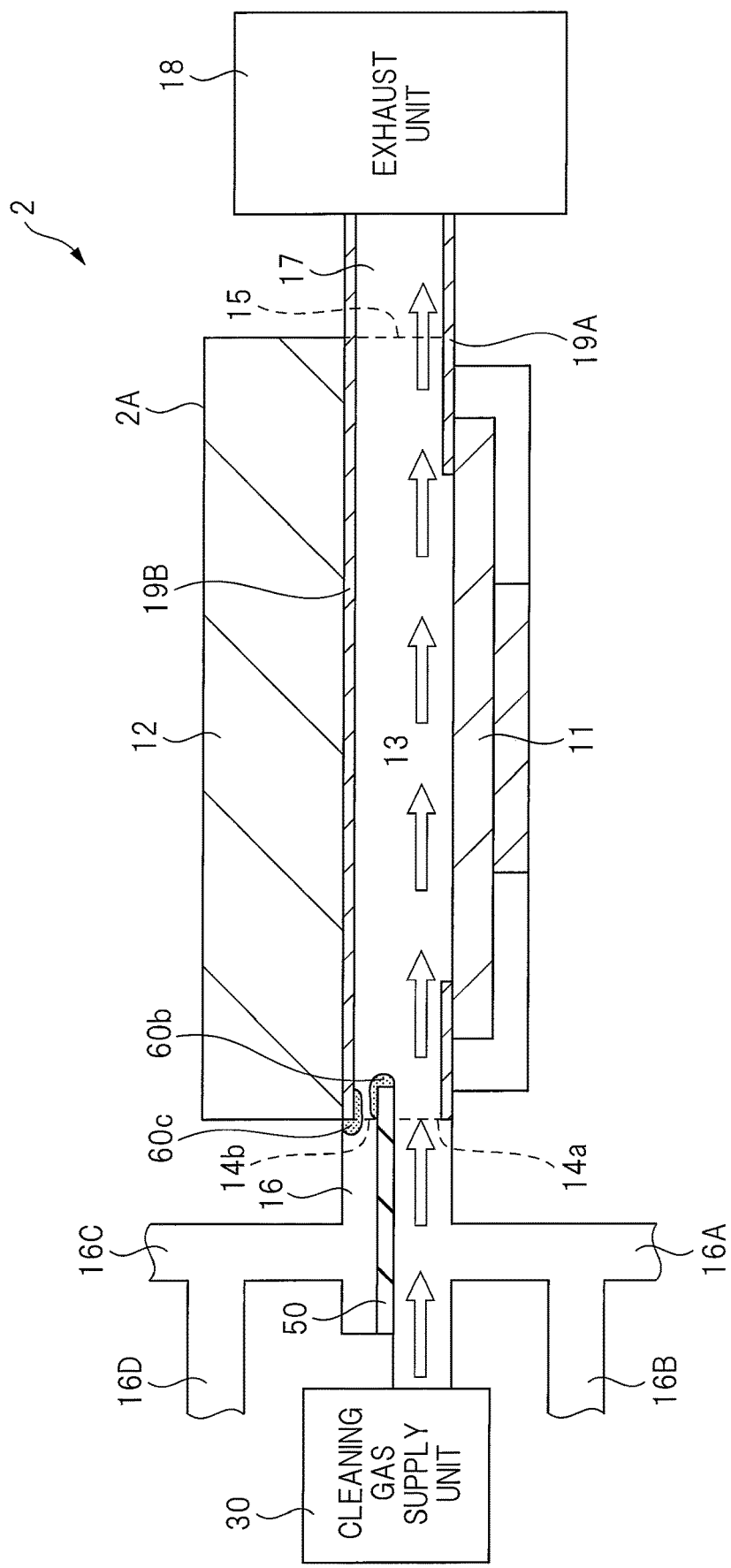
FIG. 17 is an explanatory diagram for describing a cleaning method according to a fifth embodiment.

FIG. 17 is an explanatory diagram for describing the cleaning method according to the fifth embodiment. In the fifth embodiment, as shown in FIG. 17, the cleaning gas containing fluorine radicals supplied from the cleaning gas supply unit 30 passes through the source gas supply port 14a and is introduced into the film-forming space 13, and then is exhausted from the exhaust unit 18 through the source gas exhaust port 15 and the gas exhaust path 17. In this manner, in the cleaning method according to the fifth embodiment, on the premise of the configuration of the plasma atomic layer deposition apparatus 2 according to the third embodiment which includes the source gas supply port 14a and the reaction gas supply port 14b separated from each other, the cleaning gas containing fluorine radicals is introduced only from the source gas supply port 14a without introducing the cleaning gas containing fluorine radicals from the reaction gas supply port 14b. Thus, in the cleaning method according to the fifth embodiment in which the cleaning gas containing fluorine radicals is introduced only from the source gas supply port 14a, the flow rate of the cleaning gas can be reduced, as compared with the cleaning method according to the fourth embodiment in which the cleaning gas containing fluorine radicals is introduced into the film-forming space 13 not only from the source gas supply port 14a but also from the reaction gas supply port 14b. This means that the cleaning method according to the fifth embodiment can achieve the cost reduction. From the above, it is possible to reduce the cost required for the cleaning by adopting the cleaning method according to the fifth embodiment as the cleaning method of the plasma atomic layer deposition apparatus 2 according to the third embodiment which includes the source gas supply port 14a and the reaction gas supply port 14b separated from each other.

In particular, in the cleaning method according to the fifth embodiment, the cleaning gas containing fluorine radicals is not introduced from the reaction gas supply port 14b but is introduced from the source gas supply port 14a. This is because the inner dimension size of the source gas supply port 14a is larger than the inner dimension size of the reaction gas supply port 14b and it is possible to smoothly supply the cleaning gas containing fluorine radicals into the film-forming container 2A from the source gas supply port 14a. Namely, from the viewpoint of efficiently performing the cleaning, it is important to smoothly introduce the cleaning gas containing fluorine radicals into the film-forming container 2A and to promptly exhaust the cleaning gas containing fluorine radicals from the source gas exhaust port 15.

Further, when fluorine radicals collide with an inner wall, the fluorine radicals are deactivated and become unable to demonstrate the cleaning effect. Therefore, when the cleaning gas containing fluorine radicals is introduced into the film-forming container 2A from the reaction gas supply port 14b whose inner dimension size is smaller than that of the source gas supply port 14a, the probability of collision with an inner wall of a pipe communicating with the reaction supply port 14b in the stage prior to being supplied into the film-forming container 2A increases, and the possibility that the fluorine radicals are deactivated increases. Thus, when the cleaning gas containing fluorine radicals is introduced into the film-forming container 2A from the reaction gas supply port 14b whose inner dimension size is smaller than that of the source gas supply port 14a, the efficiency of removing the necessary film adhered to the inside of the film-forming container 2A is lowered.

On the other hand, in the fifth embodiment, the cleaning gas containing fluorine radicals is introduced into the film-forming container 2A from the source gas supply port 14a whose inner dimension size is larger than that of the reaction gas supply port 14b. Thus, the probability of deactivation of the fluorine radicals is lowered, as compared with the case where the fluorine radicals are introduced into the film-forming container 2A from the reaction gas supply port 14b. Consequently, in the cleaning method according to the fifth embodiment, it is possible to suppress the reduction in the removal efficiency of the unnecessary film adhered to the inside of the film-forming container 2A, while achieving the cost reduction by reducing the flow rate of the cleaning gas containing fluorine radicals.

<Side Effect>

However, when the cleaning method according to the fifth embodiment is adopted, the following side effect occurs. The side effect will be described below.

In FIG. 17, when the cleaning gas containing fluorine radicals is introduced into the film-forming container 2A only from the source gas supply port 14a, it is difficult to remove the film 60b formed in the vicinity of the periphery of the reaction gas supply port 14b. This is because the cleaning gas containing fluorine radicals flows in a straight line from the source gas supply port 14a to the source gas exhaust port 15 as indicated by thick arrows in FIG. 17. Namely, when the cleaning method according to the fifth embodiment is adopted, the cleaning gas containing fluorine radicals does not reach the vicinity of the periphery of the reaction gas supply port 14b, with the result that the unnecessary films (film 60b and film 60c) formed in the vicinity of the periphery of the reaction gas supply port 14b are hardly removed. Then, the unnecessary film remaining in the vicinity of the periphery of the reaction gas supply port 14b is peeled off to be a foreign matter, and the foreign matter adheres to the substrate, thereby causing the deterioration of the quality of the film formed over the substrate. Therefore, when the cleaning method according to the fifth embodiment is adopted, further ingenuity is needed. The ingenuity in the fifth embodiment will be described below.

Features in Fifth Embodiment

Figure 18:
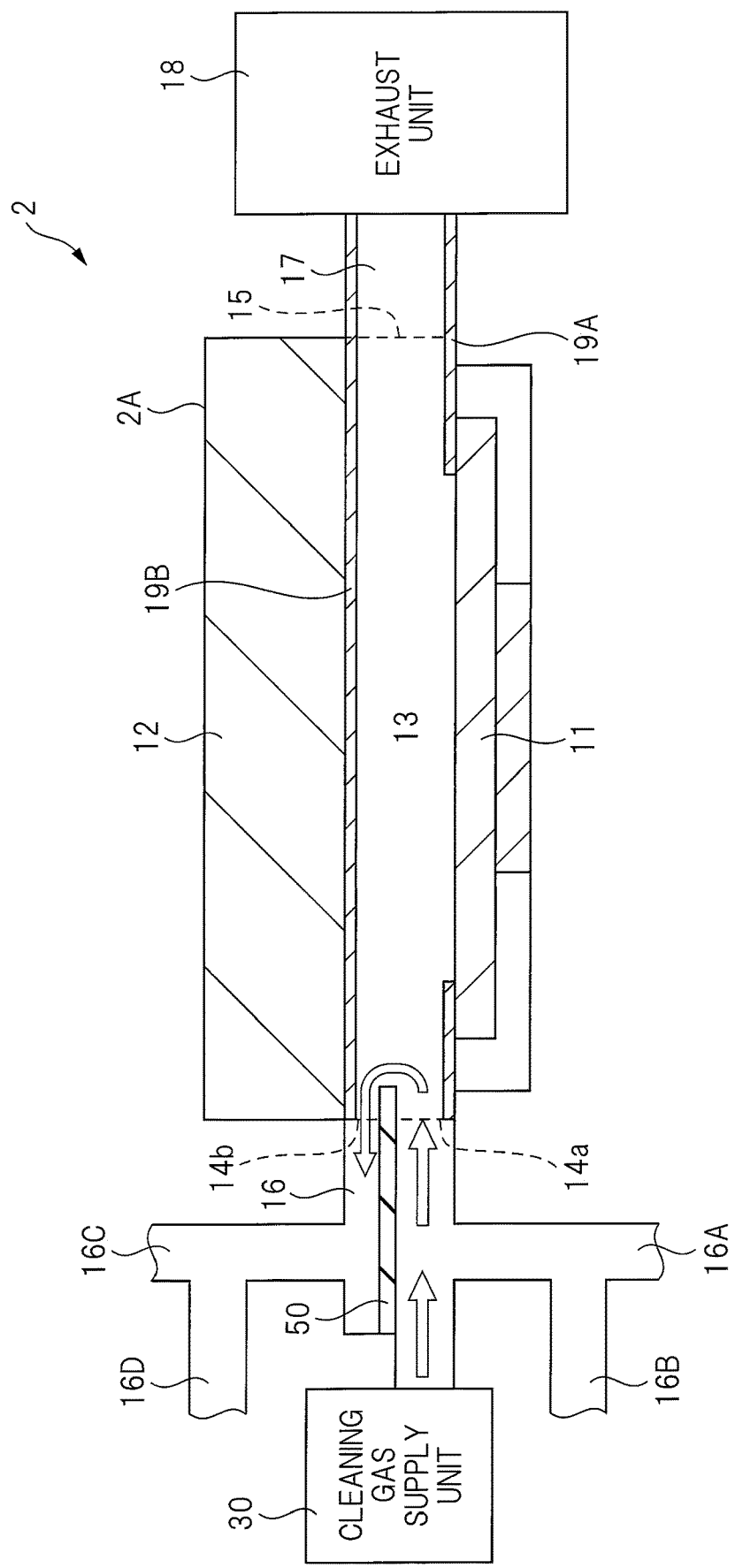
FIG. 18 is an explanatory diagram for describing a feature in the fifth embodiment.

The ninth feature in the fifth embodiment is that the process described below is performed together with the process in which the cleaning gas containing fluorine radicals is introduced into the film-forming container 2A from the source gas supply port 14a and the cleaning gas is exhausted to the outside of the film-forming container 2A from the source gas exhaust port 15 as shown in FIG. 17. Specifically, the ninth feature in the fifth embodiment is that the cleaning gas containing fluorine radicals is introduced into the film-forming container 2A from the source gas supply port 14a and then the cleaning gas is exhausted to the outside of the film-forming container 2A from the reaction gas supply port 14b as shown in FIG. 18. Consequently, according to the fifth embodiment, the unnecessary film remaining in the vicinity of the periphery of the reaction gas supply port 14b can be effectively removed. Namely, in the fifth embodiment, the source gas supply port 14a functions also as the cleaning gas supply port, and the reaction gas supply port 14b functions also as the cleaning gas exhaust port. As a result, in the cleaning method according to the fifth embodiment, by incorporating the ninth feature in the fifth embodiment, the unnecessary film adhered to the inside of the film-forming container 2A can be sufficiently removed, while achieving the cost reduction by reducing the flow rate of the cleaning gas containing fluorine radicals. Namely, the side effect that is present in the cleaning method according to the fifth embodiment can be suppressed by adopting the ninth feature in the fifth embodiment, so that it is possible to achieve both the cost reduction and the improvement of the quality of the film formed over the substrate.

Sixth Embodiment

<Basic Idea in Sixth Embodiment>

The basic idea in the sixth embodiment is premised on the configuration in which a plurality of supply paths for supplying the cleaning gas containing fluorine radicals into the film-forming container are provided and a plurality of exhaust paths for exhausting the cleaning gas to the outside of the film-forming container are provided. Further, the basic idea in the sixth embodiment is that the flow of the cleaning gas containing fluorine radicals in the film-forming container is controlled by switching the supply path and switching the exhaust path by a control unit provided in the plasma atomic layer deposition apparatus. According to the basic idea in the sixth embodiment described above, since the flow of the cleaning gas can be changed such that the cleaning gas can reach the place (dead space) which the cleaning gas does not reach by the single flow of the cleaning gas, it is possible to eliminate the place which the cleaning gas does not reach. This means that the unnecessary film left without being removed in the dead space is reduced by adopting the basic idea in the sixth embodiment. Thus, according to the basic idea in the sixth embodiment, it is possible to sufficiently remove the unnecessary film formed in the film-forming container. In the following, the schematic configuration of the plasma atomic layer deposition apparatus that embodies the basic idea in the sixth embodiment will be described with reference to drawings.

<Configuration of Plasma Atomic Layer Deposition Apparatus>

Figure 19:
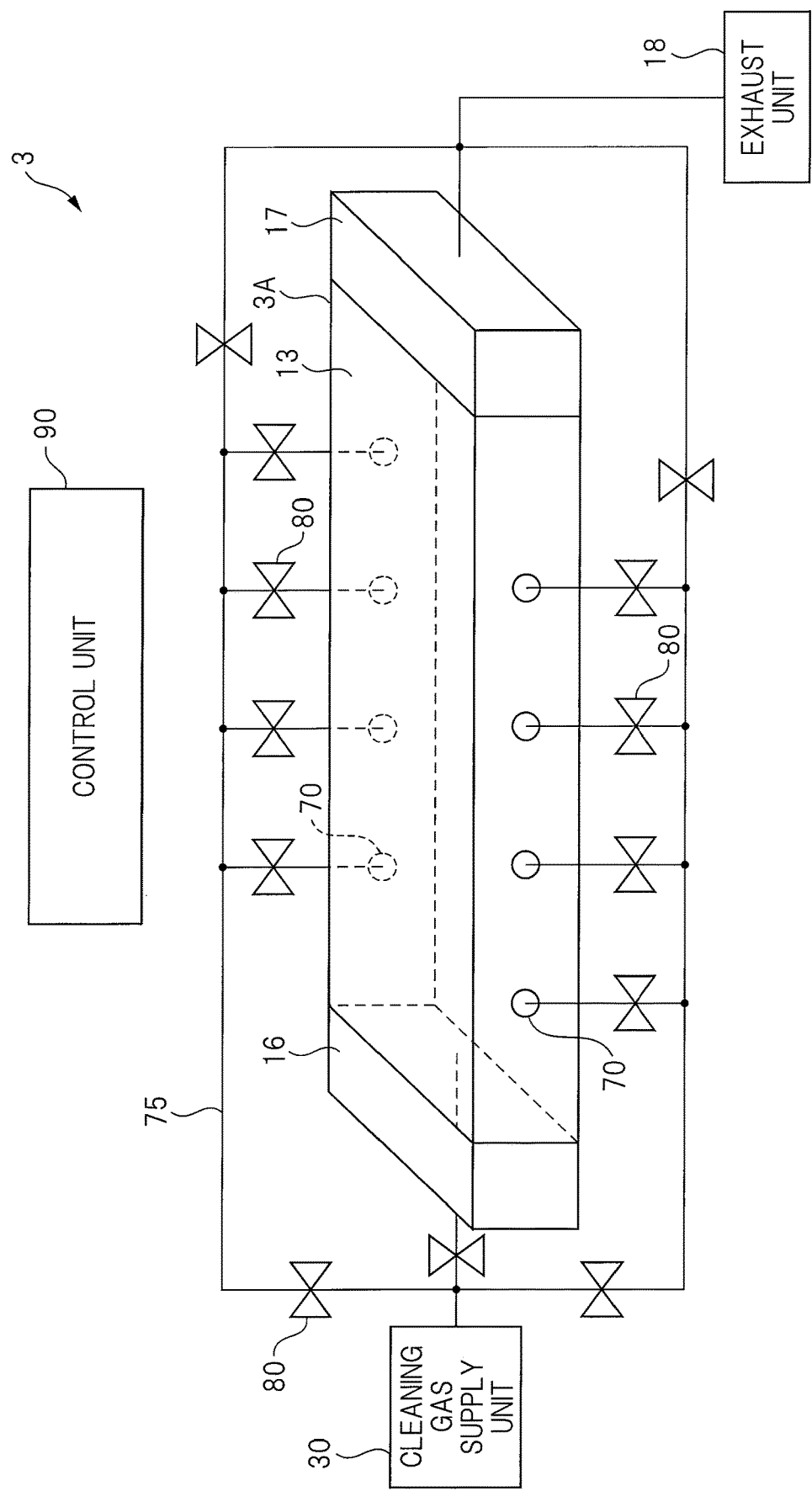
FIG. 19 is a diagram showing a schematic overall configuration of a plasma atomic layer deposition apparatus according to a sixth embodiment.

FIG. 19 is a diagram showing a schematic overall configuration of a plasma atomic layer deposition apparatus 3 according to the sixth embodiment. In FIG. 19, the plasma atomic layer deposition apparatus 3 according to the sixth embodiment includes a film-forming container 3A in which a substrate is mounted in the film-forming space 13. Further, the plasma atomic layer deposition apparatus 3 in the sixth embodiment includes a plurality of cleaning gas ports 70 provided on an inner wall of the film-forming container 3A and a pipe path section 75 connected to each of the plurality of cleaning gas ports 70 and configured to flow the cleaning gas. The pipe path section 75 is connected to the cleaning gas supply unit 30 that generates the cleaning gas containing fluorine radicals.

Further, the plasma atomic layer deposition apparatus 3 according to the sixth embodiment includes a plurality of valves 80 provided in correspondence with each of the plurality of cleaning gas ports 70 and configured to be openable and closable and a control unit 90 for controlling the open and close of each of the plurality of valves 80. At this time, the control unit 90 is configured so as to control the flow of the cleaning gas in the film-forming space 13 by controlling the open and close of each of the plurality of valves 80.

Specifically, in the cleaning method using the plasma atomic layer deposition apparatus 3 according to the sixth embodiment, the control unit 90 provided in the plasma atomic layer deposition apparatus 3 controls the open and close of each of the plurality of valves 80, thereby setting the supply path of the cleaning gas and the exhaust path of the cleaning gas. Thereafter, the plasma atomic layer deposition apparatus 3 supplies the cleaning gas into the film-forming container 3A through the supply path of the cleaning gas set by the control unit 90. Then, the plasma atomic layer deposition apparatus 3 exhausts the cleaning gas to the outside of the film-forming container 3A through the exhaust path of the cleaning gas set by the control unit 90. Thereafter, for example, after a predetermined time elapses, the open and close of each of the plurality of valves 80 are switched by the control unit 90. Thus, the flow of the cleaning gas in the film-forming container 3A can be changed by the switched supply path of the cleaning gas and the switched exhaust path of the cleaning gas. As a result, according to the cleaning method in the sixth embodiment, it is possible to eliminate the place which the cleaning gas does not reach. Therefore, according to the cleaning method using the plasma atomic layer deposition apparatus 3 in the sixth embodiment, it is possible to sufficiently remove the unnecessary film formed in the film-forming container 3A. Namely, according to the cleaning method using the plasma atomic layer deposition apparatus 3 in the sixth embodiment, it is possible to reduce the unnecessary film adhered and left without being removed in the film-forming container 3A. Consequently, according to the cleaning method using the plasma atomic layer deposition apparatus 3 in the sixth embodiment, since it is possible to suppress the foreign matter made of the peeled film from being adhered to the substrate, the quality of the film formed over the substrate can be improved.

Note that, in the sixth embodiment, the example in which the control unit 90 is provided in the plasma atomic layer deposition apparatus 3 has been described, but the basic idea in the sixth embodiment is not limited to this, and the control unit 90 may be provided outside the plasma atomic layer deposition apparatus 3.

In the foregoing, the invention made by the inventors of the present invention has been concretely described based on the embodiments. However, it is needless to say that the present invention is not limited to the foregoing embodiments and various modifications and alterations can be made within the scope of the present invention.

What is claimed is:

1. An atomic layer deposition apparatus comprising:
    a lower electrode for holding a substrate;
    an upper electrode having an opposing surface opposed to the lower electrode and configured to generate plasma discharge with the lower electrode;
    a film-forming container including a film-forming space configured of an upper space of the lower electrode and a lower space of the upper electrode;
    a lower plate member provided between a lower space of the lower electrode and the film-forming space, the lower plate member being configured to separate the lower space of the lower electrode from the film-forming space, the lower plate member being configured to suppress a formation of a film in the lower space of the lower electrode, the lower plate member being configured so that a part of a mask can be placed on an upper part of the lower plate member, wherein the lower space of the lower electrode includes a lateral annular space between a side wall of the film-forming container and a peripheral edge of the lower electrode;
    an upper plate member attached to entire surface of the opposing surface of the upper electrode, the upper plate member being configured to suppress a formation of a film on the opposing surface;
    a source gas supply port provided on a first side wall of the film-forming container and communicating with the film-forming space; and
    a source gas exhaust port provided on a second side wall of the film-forming container opposed to the first side wall of the film-forming container and communicating with the film-forming space,
    wherein the film-forming container includes:
    a lower surface on which the lower electrode is arranged; and
    an upper surface on which the upper electrode is arranged,
    the first side wall intersects with the lower surface and the upper surface, and
    the second side wall also intersects with the lower surface and the upper surface.

2. The atomic layer deposition apparatus according to claim 1,
    wherein the source gas supply port functions also as a reaction gas supply port, and
    the source gas exhaust port functions also as a reaction gas exhaust port.

3. The atomic layer deposition apparatus according to claim 1,
    wherein a pressure in the lower space of the lower electrode is equivalent to a pressure in the film-forming space.

4. The atomic layer deposition apparatus according to claim 1,
    wherein the lower plate member and the upper plate member are arranged so as to be parallel to each other.

* * * * *